United States Patent
Rusian et al.

(10) Patent No.: US 9,000,389 B2
(45) Date of Patent: Apr. 7, 2015

(54) RADIATION DETECTORS AND METHODS OF FABRICATING RADIATION DETECTORS

(75) Inventors: Peter Rusian, Ashdod (IL); Arie Shahar, Moshav Magshimim (IL)

(73) Assignee: General Electric Company, Schenectady, NY (US)

( * ) Notice: Subject to any disclaimer, the term of this patent is extended or adjusted under 35 U.S.C. 154(b) by 164 days.

(21) Appl. No.: 13/419,934

(22) Filed: Mar. 14, 2012

(65) Prior Publication Data
US 2013/0126999 A1 May 23, 2013

Related U.S. Application Data

(63) Continuation-in-part of application No. 13/302,835, filed on Nov. 22, 2011.

(51) Int. Cl.
G01T 1/24 (2006.01)
H01L 31/08 (2006.01)
H01L 27/146 (2006.01)

(52) U.S. Cl.
CPC .......... *H01L 31/085* (2013.01); *H01L 27/1462* (2013.01); *H01L 27/14676* (2013.01)

(58) Field of Classification Search
USPC ............ 257/448, E31.124; 438/73, 778, 958, 438/58; 250/370.01; 216/37, 97
See application file for complete search history.

(56) References Cited

U.S. PATENT DOCUMENTS

| | | | |
|---|---|---|---|
| 6,034,373 A * | 3/2000 | Shahar et al. | 250/370.01 |
| 6,121,622 A | 9/2000 | Beyne et al. | |
| 6,215,123 B1 * | 4/2001 | Orava et al. | 250/370.13 |
| 6,362,484 B1 | 3/2002 | Beyne et al. | |
| 6,410,922 B1 * | 6/2002 | Spartiotis et al. | 250/370.09 |
| 6,488,767 B1 * | 12/2002 | Xu et al. | 117/2 |
| 6,528,814 B1 | 3/2003 | Frank et al. | |
| 6,649,915 B2 * | 11/2003 | Wright et al. | 250/370.13 |
| 7,223,982 B1 * | 5/2007 | Chen et al. | 250/370.13 |
| 7,410,606 B2 | 8/2008 | Appleby et al. | |
| 7,518,136 B2 | 4/2009 | Appleby et al. | |
| 7,589,324 B2 * | 9/2009 | Chen et al. | 250/370.08 |
| 7,955,992 B2 * | 6/2011 | Chen et al. | 438/778 |
| 8,093,094 B2 * | 1/2012 | Stahle et al. | 438/92 |
| 2003/0121885 A1 * | 7/2003 | Wright et al. | 216/37 |
| 2009/0236535 A1 * | 9/2009 | Soldner | 250/370.13 |
| 2010/0193694 A1 * | 8/2010 | Chen et al. | 250/370.01 |
| 2011/0156198 A1 * | 6/2011 | Chen et al. | 257/448 |
| 2011/0221039 A1 * | 9/2011 | Singh et al. | 257/615 |

* cited by examiner

*Primary Examiner* — Bradley K Smith
*Assistant Examiner* — David Goodwin
(74) *Attorney, Agent, or Firm* — Dean Small; The Small Patent Law Group LLC

(57) ABSTRACT

Radiation detectors and methods of fabricating radiation detectors are provided. One method includes mechanically polishing at least a first surface of a semiconductor wafer using a polishing sequence including a plurality of polishing steps. The method also includes growing a passivation oxide layer on a top of the polished first surface and depositing patterned metal contacts on a top of the passivation oxide layer. The method further includes applying a protecting layer on the patterned deposited metal contacts, etching a second surface of the semiconductor and applying a monolithic cathode electrode on the etched second surface of the semiconductor. The method additionally includes removing the protecting layer from the patterned metal contacts on the first surface, wherein the patterned metal contacts are formed from one of (i) reactive metals and (ii) stiff-rigid metals for producing inter-band energy-levels in the passivation oxide layer.

25 Claims, 15 Drawing Sheets

RADIATION DETECTORS AND METHODS OF FABRICATING RADIATION DETECTORS

CROSS-REFERENCE TO RELATED APPLICATIONS

This application is a Continuation-In-Part, and claims priority to and the benefit of the filing date of U.S. patent application Ser. No. 13/302,835 filed on Nov. 22, 2011, the subject matter of which is herein incorporated by reference in its entirety.

BACKGROUND OF THE INVENTION

The subject matter disclosed herein relates generally to radiation detectors and more specifically to radiation detectors for medical imaging, such as Nuclear Imaging (NI), Single Photon Emission Computed Tomography (SPECT), Positron Emission Tomography (PET) and Computed Tomography (CT).

Room temperature pixelated radiation detectors made of semiconductors, such as Cadmium Zinc Telluride (CdZnTe or CZT) semiconductors, have entered into the commercial phase in medical imaging. In this commercial phase, it is desirable for these detectors to exhibit high performance, especially with respect to energy resolution and sensitivity. In addition, these detectors, which are often the core technology integrated into camera heads of systems such as SPECT, PET and CT, should be stable, reliable and produced with high yield to reduce cost.

The radiation semiconductor detectors generally include two surfaces, one having a cathode monolithic electrical-contact applied thereto and another having surface pixelated anodes electrical contacts applied thereto. Prior to the application of the electrical contacts, the first and the second surfaces are etched by chemical wet etching. In CZT radiation detectors, the wet etching is done for at least two reasons: 1) to remove the mechanical damage from the surfaces introduced in previous fabrication steps where the semiconductor wafers of the detectors have been sliced and polished and 2) to create surfaces, which are tellurium rich, which is used to produce Ohmic contacts such as Indium contacts applied to CZT wafers.

The tellurium rich first surface on which the anodes contacts are applied have gap regions between the anodes contacts. The excess tellurium in the regions between the anodes causes these gaps to be of a relatively low surface resistance, which is also instable. The instability results in a reduction in the detector performances such as energy resolution and sensitivity, fabrication with relatively low production yield resulting in high cost detectors and unstable detectors with reduced reliability having quality degradation over time.

BRIEF DESCRIPTION OF THE INVENTION

In one embodiment, a method for fabricating a radiation detector is provided. The method includes mechanically polishing at least a first surface of a semiconductor wafer using a polishing sequence including a plurality of polishing steps, wherein a last polishing step of the polishing sequence includes polishing with a slurry having a grain size smaller than about 0.1 µm to create a polished first surface. The method also includes growing a passivation oxide layer on a top of the polished first surface to seal and passivate the polished first surface and depositing patterned metal contacts on a top of the passivation oxide layer having at least one pattern being (i) a pattern of pixelated anodes or (ii) a pattern of pixelated anodes with grid electrodes having lines of electrodes aligned along centers of gaps between the anodes. The method further includes applying a protecting layer on the patterned deposited metal contacts to protect the metal pattern on the first surface, etching a second surface of the semiconductor and applying a monolithic cathode electrode on the etched second surface of the semiconductor. The method additionally includes removing the protecting layer from the patterned metal contacts on the first surface, wherein the patterned metal contacts are formed from one of (i) reactive metals and (ii) stiff-rigid metals for producing inter-band energy-levels in the passivation oxide layer.

In another embodiment, a method for fabricating an anode side of a radiation detector. The method includes mechanically polishing at least a first surface of a semiconductor wafer using a plurality of polishing steps, growing a passivation oxide layer on a top of the polished first surface and forming patterned metal contacts on a top of the of the passivation oxide layer using a dry process without wet chemical etching.

In a further embodiment, a radiation detector is provided that includes a semiconductor, a passivation layer on a first surface of the semiconductor and pixelated anode electrodes on the passivation layer. The radiation detector further includes rectifying anodes producing inter-band energy-levels in the passivation layer and a monolithic cathode of a second surface of the semiconductor opposite the first surface.

DETAILED DESCRIPTION OF THE INVENTION

Figure 1:
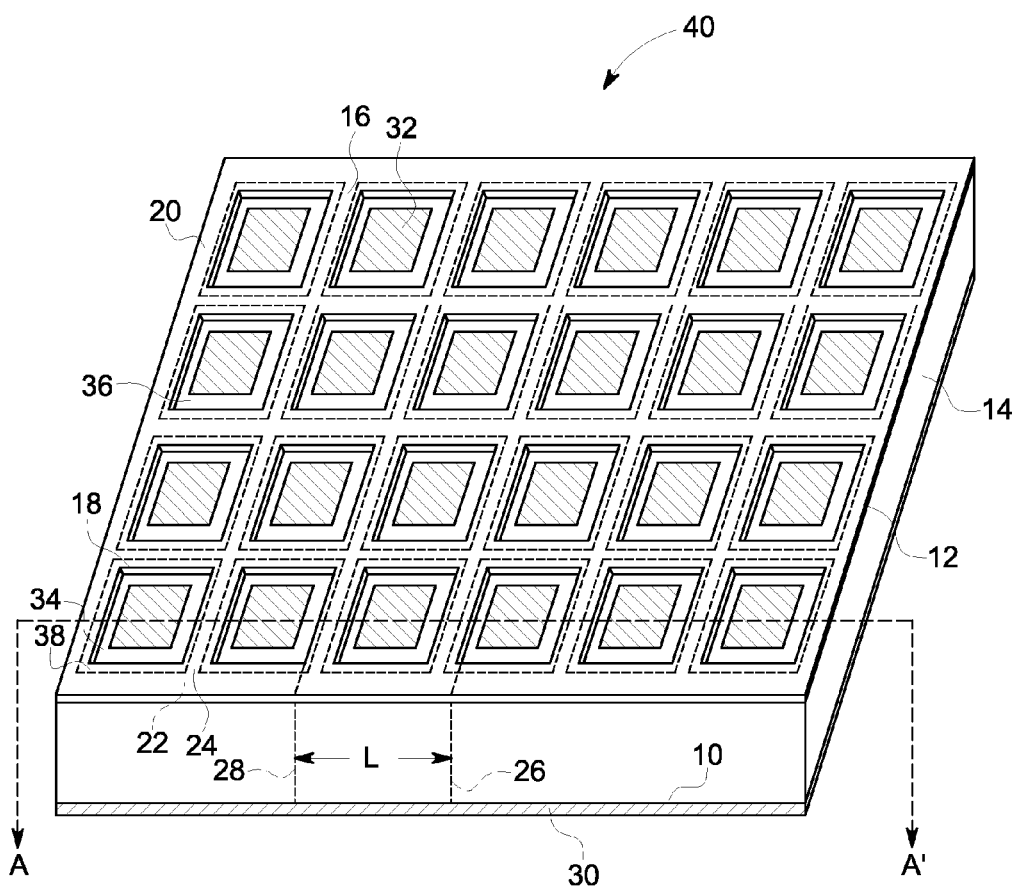
FIG. 1 is a schematic illustration of a radiation detector fabricated in accordance with various embodiments.

The following detailed description of certain embodiments will be better understood when read in conjunction with the appended drawings. To the extent that the figures illustrate diagrams of the blocks of various embodiments, the blocks are not necessarily indicative of the division between hardware or components. Thus, for example, one or more of the blocks may be implemented in a single piece of hardware or component or multiple pieces of hardware or components. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Described herein are various embodiments for fabricating a radiation detector. By practicing at least one embodiment, higher quality radiation detectors having improved energy resolution and sensitivity may be provided. By practicing at least some embodiments an improved reliable process for fabricating radiation detectors may be provided having increased production yield that reduces the detector cost.

The radiation detectors of various embodiments are generally formed wherein a first surface that includes pixelated anodes is partially etched by chemical wet etching and in which the first surface of the radiation detector includes pixelated anodes under which the first surface is etched by chemical etching, wherein gaps between the pixelated anodes on the first surface are not etched by chemical wet etching. In various other embodiments, radiation detectors may be fabricated in which the first surface of the radiation detector includes pixelated anodes under which the first surface is etched by chemical etching and the gaps between the pixelated anodes on the first surface are gently polished mechanically to maintain a stoichiometric structure of the semiconductor material in these regions. Moreover, the gap regions between the anodes may be encapsulated by a protective layer to provide longer term stability of the detectors. The first surface of the radiation detector that includes pixelated anodes also may be fabricated using, for example, photolithography techniques including liftoff as described in more detail herein.

Additionally, in various embodiments, the first surface of the radiation detector includes pixelated anodes fabricated on regions in the first surface etched by chemical wet etching to improve electrical contact and to create undercut regions under the encapsulation layer. In various embodiments, an efficient and reliable liftoff process for improving production yield may result. In some embodiments, the fabrication process may be simplified by simultaneously etching the first and the second surface of the detectors wherein the first surface is etched partially only in the regions where the anodes are applied on the following fabrication step. Thus, various embodiments provide a selective etching process that can yield increased production yield, for example, an improvement of 40% in some embodiments relative to a standard process that includes complete wet etching of the anodes surface.

In other various embodiments, completely dry fabrication processes and methods are provided, such as to fabricate radiation detectors. These methods may provide additional productions yields, for example, in some embodiments, an improvement of 15%. In these embodiments, a pixelated semiconductor radiation-detector may be produced, wherein the surface side of the anodes is mechanically polished by a non-standard mechanical polishing process including multiple steps. At least one of steps includes using a slurry having non-standard grain-sizes of less than 0.1 µm. By practicing these embodiments, a substantially damage free surface suitable for the application of anodes contacts thereon may be provided. Additionally, a substantially stoichiometric surface suitable for the application of anodes contacts thereon also may be provided. In some embodiments, the stoichiometric surface has no access to one of the components of the semiconductor material, from which the surface is made, to reduce or prevent oxidation of this surface to provide high surface resistivity and detector performances that do not degrade with time.

It should be noted that radiation detectors formed in accordance with various embodiments may be used, for example, in imaging systems to reconstruct or render an image. However, the term "reconstructing" or "rendering" an image or data set is not intended to exclude embodiments in which data representing an image is generated, but a viewable image is not. Therefore, when used, "image" broadly refers to both viewable images and data representing a viewable image that may be generated from data acquired by a radiation detector of one or more embodiments. One or more radiation detectors formed in accordance with various embodiments may be used to image an object, such as a human individual, another living creature besides a human individual, or inanimate objects, such as, but not limited to, luggage, shipping containers, and/or the like. However, in other embodiments, no image is generated or formatted and other data is acquired by the radiation detectors, such as spectral response data.

FIG. 1 is a schematic illustration of a perspective view of a radiation detector 40 designed and fabricated according to various embodiments. The detector 40 is formed from a semiconductor 14 (e.g., a semiconductor material) that may be, for example, a Cadmium Zinc Telluride (CdZnTe or CZT) semiconductor. The semiconductor 14 includes a first surface 12 on which pixelated anodes 32 are formed and a second surface 10 on which a monolithic cathode 30 is formed. An encapsulation or passivation layer 20 having openings 34, in which anodes 32 are formed, is deposited on top of the first surface 12. The layer 20 may be made, for example, of Zinc Sulfide (ZnS). Additionally, gaps 16 are formed, which are the spaces under the encapsulation layer 20 between the anodes 32.

Surfaces 36 of the semiconductor 14 under the anodes 32 are chemically etched via openings 34 in the layer 20, which can improve the quality of the electrical contact of the anodes 32 to the semiconductor 14 and also form undercut regions 38 (e.g., wedge shaped undercut regions), under the layer 20 between edges 18 of the openings 34 and the ends of the undercut regions 38 represented by the lines 22. As described below with respect to the fabrication process, the undercut regions 38 between the edges 18 of the openings 34 and the lines 22 facilitate a liftoff process used in the fabrication of the detector 40.

The pixelated anodes 32 and a monolithic cathode 30 in one embodiment are metal contacts that may be made, for example, of Indium (In), Gold (Au), Platinum (Pt), or Aluminum (Al), among other metals, or may be a stack of layers including some or all of these metals to produce Ohmic or blocking contacts. The gaps 24, which are the spaces under the encapsulation layer 20 between the undercut lines 22, are fabricated between the anodes 32 without using chemical wet etch in various embodiments.

It should be noted that a region L between the edges 18 of the openings 34 marked by lines 26 and 28 are illustrated in the various figures in a side-view cross-section of the detector 40 oriented along line AA'.

Figure 2:
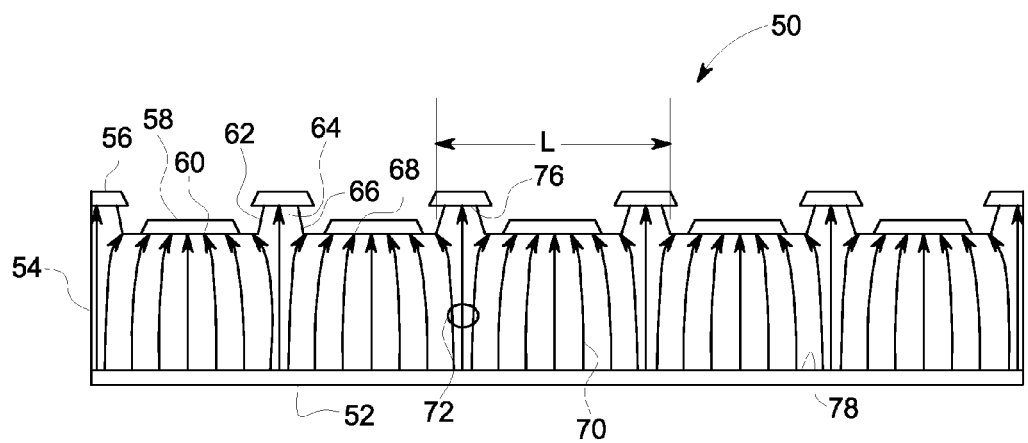
FIG. 2 is a diagram schematically illustrating the distribution of electrical-field lines in biased radiation detectors when gaps regions between the anodes are produced with wet chemical etching.
Figure 3:
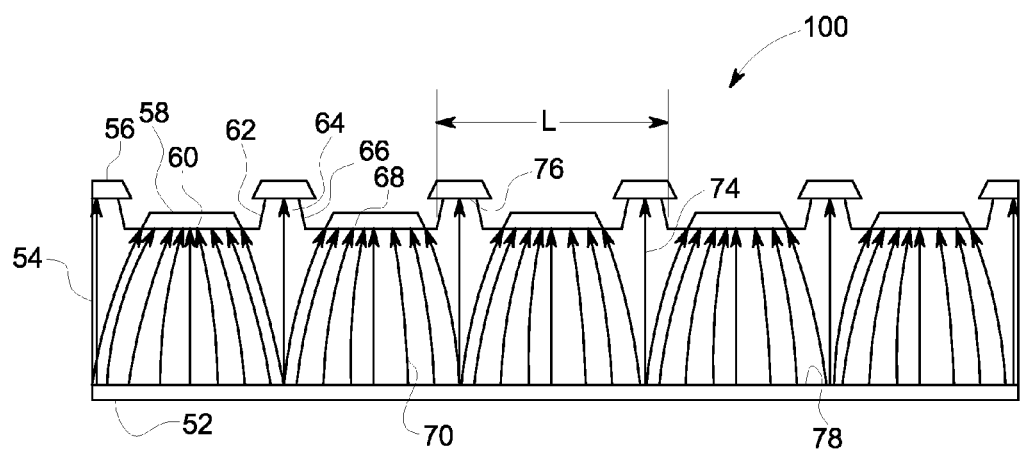
FIG. 3 is a diagram schematically illustrating the distribution of electrical-field lines in biased radiation detectors when the gaps regions between the anodes are produced without wet chemical etching in accordance with various embodiments.

FIGS. 2 and 3 illustrate a geometrical structure similar to the geometrical structure of the side-view cross-section of the detector 40 of FIG. 1 oriented along lines AA' of FIG. 1. It should be noted that the proportion and/or scale between the different elements of the detector 40 of FIG. 1 is different from the proportion and/or scale between the elements of the detectors 50 and 100 of FIGS. 2 and 3, respectively. Thus, even though the geometrical structures of the detectors 40, 50 and 100 of FIGS. 1-3 are similar, the above mentioned proportions and/or scales of FIGS. 2 and 3 are different from the proportion and/or scale of FIG. 1 to clarify the illustration of the elements of detectors 50 and 100 of FIGS. 2 and 3, respectively. It also should be understood that the detectors 40, 50 and 100 are schematically illustrated by FIG. 1-3, respectively and the proportions between the elements is not maintained to reflect the actual dimensions of the elements in these detectors.

More particularly, a monolithic cathode 52, semiconductor 54, encapsulation layer 56, pixelated anodes 58, surfaces 60 and 68 under anodes 58, undercuts regions 62 and 66 beneath a layer 56, gaps 64 between anodes 58, and an interval L of FIGS. 2 and 3 correspond to the monolithic cathode 30, semiconductor 14, encapsulation layer 20, pixelated anodes 32, surfaces 36 under the anodes 58, undercut regions 38 beneath the layer 20, gaps 24 between the anodes 32 and interval L of FIG. 1, respectively.

As described in more detail herein, while the radiation detectors 50 and 100 have similar geometrical structures, the fabrication processes for each are different. In particular, the detector 50 is produced such that gaps 64 between the anodes 58 are chemically etched before the encapsulation layer 56 is applied to the semiconductor 54 on top of the gaps 64. Unlike the detector 50, the detector 100 is produced such that gaps 64 between the anodes 58 are not chemically etched before the encapsulation layer 56 is applied to the semiconductor 54 on top of the gaps 64.

In various embodiments, the chemical etching of the surfaces 60 and 68 of the detector 50 and 100 is provided for:

1. Removing polishing mechanical-damage from the surfaces of the semiconductor 54 from which detector 50 is made; and 2. Creating non-stoichiometric surfaces 60, 68 and 78 of the semiconductor 54 under the anodes 58 and the cathode 52 having an excess of one of the components of the semiconductor 54, such as an excess of Tellurium (Te) when the semiconductor 54 is a CZT semiconductor and is chemically etched by Bromine Methanol or Bromine Ethylene Glycol. This non-stoichiometric surface with the excess of one of the elements of the semiconductor 54 can improve the quality of the electrical contacts of the anodes to the semiconductor 54.

The detector 50 of FIG. 2 includes gaps 64 between the anodes 58 having chemically etched surfaces 76 under the encapsulation layer 56. The surfaces 76 of the gaps 64 similar to surfaces 60, 68 and 78, are etched by a chemical wet process and thus, are non-stoichiometric surfaces including excess of one of the elements of semiconductor 54.

As described above, the excess of one of the elements of semiconductor 54, such as excess Te produced when the semiconductor 54 is a CZT semiconductor and is chemically etched by Bromine Methanol or Bromine Ethylene Glycol, is provided in surfaces 60, 68 and 78 so as to improve the quality of the electrical contacts between the semiconductor 54 and metal electrodes 58 and 76 formed on surfaces 60, 68 and 78 in various embodiments. However, this is not the case with the chemically etched surfaces 76 of the gaps 64 between the anodes 58 located under the encapsulation layer 56, for example, with the excess Te produced on the semiconductor 54 when etching the CZT semiconductor 54 by a chemical wet etch using Bromine Methanol or Bromine Ethylene Glycol. The presence of Te, Bromine ($Br_2$), Oxygen (O), Humidity ($H_2O$) and other materials that may be present on the surfaces 76 of the gaps 64 between the anodes 58 of the detector 50 during the fabrication process of the detector 50, create a film or layer on top of the surfaces 76 that is made of a compound of at least part of the chemical materials described above.

The film or layer on top of the surfaces 76 has a resistivity that is relatively low in comparison to the resistivity of the bulk of the semiconductor 54. This low resistivity affects the line distribution of lines 70 of the electrical field that exist in the detector 50 when the detector 50 is electrically biased between the cathode 52 and the anodes 58, such as when the anodes 58 are biased with a voltage that is more positive than the voltage applied to the cathode 52.

The lower the resistivity of the layer produced by the wet chemical etch of the semiconductor 54 on top of the surfaces 76, the more lines 70 of the electric field are oriented toward the gaps 64. These lines 70 of the electrical field oriented toward the gaps 64 between the anodes 58 are identified as a group of lines 72.

In operation, photons that are detected and absorbed by the detector 50, produce charge carriers in the form of electrons and holes. In some of the events, the electrons drift along the electrical field lines 70 toward the anodes 58 to produce an electrical signal that is proportional to the energy of the photon absorbed and detected by the detector 50. In the events when the detected photons are absorbed in the detector 50 in regions beneath the gaps 64, the electrons produced by the absorption of the detected photons in the semiconductor 54 drift along the lines 72 toward the regions 64 between the anodes 58. The trajectories of the electron drift along the lines 72 create a transportation path of the electrons in which the electrons arrive at the surface 76 prior to collection of the electrons by the anodes 58.

When the electrons arrive at the surface 76, at least part of the electrons recombine at the surface 76 by surface recombination and only part of the electrons arrive at the anodes 58 and are collected at the anodes 58. When only part of the electrons arrives at the anodes 58, the charge collection by the anodes 58 is incomplete.

When the charge collection by the anodes 58 is incomplete, the performance of the detector, such as energy resolution and sensitivity can degrade, thereby resulting in a lower quality detector. The surfaces 76 of the gaps 64 between the anodes 58 of the detector 50 are chemically etched after being polished by a suitable (e.g., standard) mechanical process to remove the mechanical damage produced by the standard mechanical polish. The mechanical damage left after the mechanical polish reduces the resistivity of the surfaces 76 and increases the surface recombination of the electrons arriving to the surfaces 76 along the lines 72, resulting in strong incomplete charge collection by the anodes 58. Thus, the surfaces 76 have even lower resistivity than after the chemical etch if the surfaces 76 are left only with the mechanical polish without the chemical wet etch.

In addition to the incomplete charge collection by the anodes 58, the layer on top of the surfaces 76 under the encapsulation layer 56 produced by the chemical etch of the semiconductor 54 is chemically active even after the encapsulation by the encapsulation layer 56 and causes the detector 50 to further degrade with time. This degradation is due to further reduction in the resistivity of the layer on top of the surfaces 76 under the encapsulation layer 56, even after being installed in a system operating at a site (e.g., at a hospital).

Since the detector 50 has reduced quality, the number of detectors that can be fabricated to meet a certain specification is reduced as well. In this case, the production yield may be relatively low and the manufacturing cost relatively high, and also with the instability and reliability problems.

Accordingly, the detector 50 may have:

1. Reduced quality due to incomplete charge collection that degrades the energy resolution and sensitivity of the detector.
2. Instability and low reliability caused by the continuous chemical activity of the layer formed on top of the surfaces 76 under the encapsulation layer 56, by the wet chemical etching.
3. Relatively low production yield resulting at a relatively high manufacturing cost.
4. Relatively low commercial value.

The detector 100 of FIG. 3 is fabricated in accordance with other embodiments by a different approach. In the detector 100, the surfaces 76 are not chemically etched and are polished by non-standard polishing steps. In various embodiments, the top first surface of the detector 54 is very gently polished (as described in more detail herein) by a mechanical non-standard polish to leave the first top surface substantially damage free. In this case, the first top surface of the detector 100 is left without wet chemical etch since there is no need to remove the mechanical damage of the polish because there is substantially no damage in this surface.

Thus, without the chemical wet-etch, the first top surface of the detector 100 has a stoichiometric structure with no excess of one of the elements of the semiconductor in these surfaces. After the non-standard mechanical polish of the top first surface of the detector 100, this surface is partially etched, by chemical wet etch, to etch only the surfaces 60, 62, 66 and 68. The chemical etched in the regions 60, 62, 66 and 68 improves the electrical contact between the anodes 58 and the semiconductor 54. After the partial etch of the top first surface of the detector 100, the surfaces 76 on top of the regions 64 are left partially without being chemically etched and are processed only by the gentle non-standard mechanical polish.

In various embodiments, the surfaces 76 of the gaps 64 between the anodes 58 of the detector 100 are substantially damage free and without the relatively low-resistivity layer, which exists on the top of surfaces 76 of the detector 50 of FIG. 2, resulting in high resistivity gaps 64 between the anodes 58 of the detector 100.

Accordingly, the surfaces 76 have a resistivity that is similar to the resistivity of the bulk of the semiconductor 54 (also referred to as bulk resistivity). This relatively high resistivity affects the line distribution of the lines 70 of the electrical field in the detector 100 when electrically biased between the cathode 52 and the anodes 58, such as when the anodes 58 are biased with a voltage that is more positive than the voltage applied to the cathode 52.

The relatively high resistivity of the surfaces 76 of the gaps 64, produced by the gentle non-standard mechanical polish and without the wet chemical etch of the semiconductor 54 on top of the surfaces 76, reduces the number of lines 70 of the electric field, oriented toward the gaps 64, into substantially a single line 74. The single line 74 always exists due to the geometrical symmetry between biased anodes 58 and is independent of the resistivity of the surfaces 76.

In operation, photons that are detected and absorbed by the detector 100, produce charge carriers in the form of electrons and holes. The electrons drift along the electrical field lines 70 toward the anodes 58 to produce an electrical signal that is proportional to the energy of the photon absorbed and detected by the detector 100. Even in the event when the detected photons are absorbed in the detector 100 in regions beneath the gaps 64, most of the electrons produced by the absorption of the detected photons in the semiconductor 54 drift along the majority of the lines 70 toward the anodes 58 and few drift along the single line 74 toward the regions 64 between the anodes 58. The trajectories of the few electrons that drift along the single line 74 create a transportation path of the electrons in which the electrons arrive at the surface 76 prior to collection of the electrons by the anodes 58.

The few electrons that still arrive at the surfaces 76 suffer very low surface recombination because the surfaces 76, polished by the non-standard gentle polish, are substantially damage free, thus, electrons arriving at the anodes 58, via the surfaces 76, substantially do not suffer from incomplete charge collection by the anodes 58. Because few electrons arrive at the surfaces 76 prior to collection by the anodes 58 and because the few electrons that still arrive at the surfaces 76, along the single line 74, substantially do not suffer from surface recombination, the incomplete charge collection of the detector 100 is negligible in various embodiments.

When the charge collection by the anodes 58 of the detector 100 is substantially complete, the performance of the detector 100, such as energy resolution and sensitivity are improved in various embodiments and the detector has higher performance and is of higher quality. Various embodiments, thus, produce detectors 100 that meet a desired or required specification and enable high production yield at relatively low cost.

As described above, the surfaces 76 of the gaps 64 between the anodes 58 of the detector 100 are gently polished, by a non-standard polish process and even though the surfaces 76 are processed without chemical wet etched, the surfaces 76 are substantially damage free due to the gentle non-standard polish process. Thus, the detector 100 has no low-resistivity layer on top of the surfaces 76 under the encapsulation layer 56, which is chemically active even after the encapsulation, increasing the stability and reliability of the detector 100.

Thus, by practicing various embodiments, the detector 100 is provided that has:

1. High quality due to substantially complete charge collection that improves the energy resolution and sensitivity of the detector.
2. High stability and reliability caused by the gentle and non-standard mechanical polish of the surfaces 76, which is not followed by chemical etch and thus has no low resistivity and chemically active layer on top of the surfaces 76 under the encapsulation layer 56.
3. High production yield resulting in relatively low manufacturing cost.
4. High commercial value.

FIGS. 4-12 schematically illustrate the fabrication steps according to one embodiment for fabricating a detector, such as the detector 100 of FIG. 3. It should be noted that the same referral numerals are used in the various figures to describe similar parts. To clarify the figures and for ease of understanding of the fabrication steps of the detector schematically illustrated by FIGS. 4-12, the interval L shown in FIGS. 1-3 is magnified and substantially only this interval of the detector 100 of FIG. 3 is illustrated by FIGS. 4-12. It should be noted that even though FIGS. 3-12 illustrate the detector 100 with different schematic perspective views, the figures may show the detector 100 with different proportions between the various parts.

Figure 4:
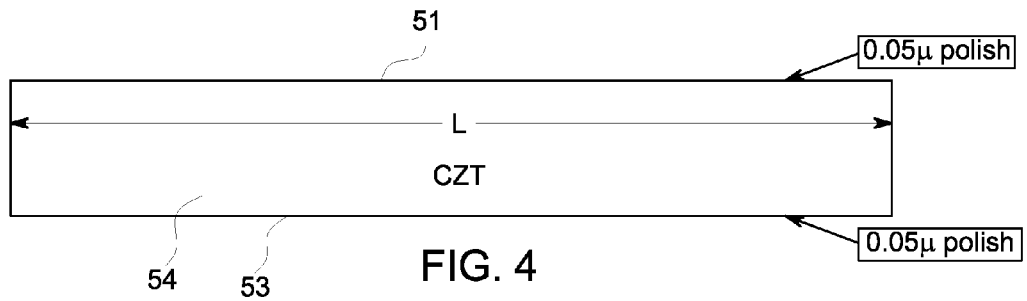
FIGS. 4-12 are diagrams illustrating the fabrication steps involved in the production of radiation detectors according to various embodiments.

FIG. 4 schematically shows the semiconductor 54 that may be made of a CZT wafer having a width L, a first top surface 51 and a second lower surface 53. In the first fabrication step of the detector 100 as shown in FIG. 4, the first and second surfaces 51 and 53 of the semiconductor 54 are mechanically polished in a process that may include double side polishing or side by side polish. The polishing includes several polishing steps in which each successive polishing step is performed with a slurry having grains, such as alumina, silica or silicon carbide grains, which are smaller than the grains in the slurry of the previous polishing step. In each polishing step of the semiconductor wafer 54, the mechanical damage left in the surface of semiconductor 54, after the polish step, is proportional to the grain size in the slurry used in this polishing step.

The sequence of polishing steps is provided to remove the mechanical damage of the previous polishing step by the next polishing step while the damage left in the first and second surfaces 51 and 53 of the semiconductor 54 after the next polishing step is smaller than the corresponding damage left in the surfaces 51 and 53 of the semiconductor wafer 54 after the previous polishing step because the next step includes a slurry with smaller grains. Accordingly, the mechanical damage in the surfaces 51 and 53 reduces with the amount of steps in the sequence of the polishing process in various embodiments.

The detector 100 is, thus, fabricated by polishing and etching methods described below. In particular, in one embodiment, in the fabrication process of the detector 100 of FIG. 3, the semiconductor wafer 54 of FIG. 4 is polished with a longer polishing sequence including more polishing steps, such as that are used in the polishing sequence of the detector 50. For example, in various embodiments, four polishing steps are performed with the last step in the sequence of the polishing steps of the detector 100 including a slurry with a grain size less than 0.1 µm, for example, a grain size of 0.05 µm. In one embodiment, the sequence of polishing includes the use of a series of slurries having grain sizes of 9 µm, 1 µm, 0.6 µm and 0.05 µM in polishing steps 1 to 4, respectively.

The small size of the grains involved in the polishing of the surfaces 51 and 53 of wafer 54 of FIG. 4, leaves these surfaces substantially damage free with a resistivity that is similar to the resistivity of the bulk of the semiconductor wafer 54. In this process of fabricating the detector 100, the surfaces 76 above the gaps 64 between the anodes 58 of FIG. 3 have a resistivity that is very high and is suitable to produce the detectors 100 without chemical etching of the surfaces 76 of FIG. 3 and as shown in FIG. 4.

Figure 5:
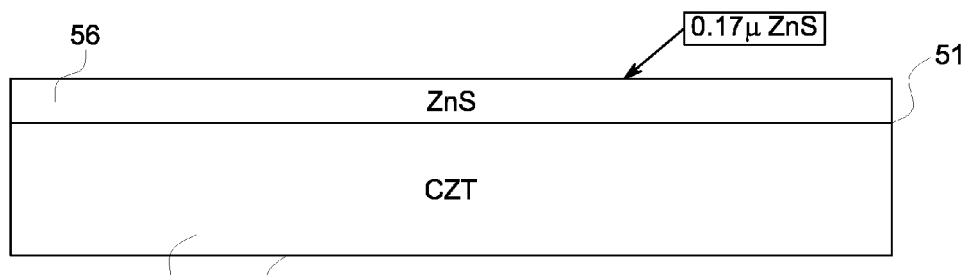

FIG. 5 schematically illustrates the semiconductor wafer 54 in the second step of fabricating the detector 100. In this step, the encapsulation layer 56 is applied to the first surface 51 of the wafer 54 in a process that may include, for example, evaporation, spattering or deposition of the encapsulation layer 56 on the surface 51. In one embodiment, where the wafer 54 is made of a CZT semiconductor, the encapsulation layer 56 may be made of Zinc Sulfide (ZnS). The encapsulation layer 56 protects and seals the first surface 51 from being exposed to contamination and humidity that may cause resistivity reduction of the surfaces 76 on top of the gaps 64 under the layer 56 of FIG. 3.

The encapsulation layer 56 generally has a good adhesion to the surface 51 of the wafer 54 with a lattice constant similar to the lattice constant of the semiconductor wafer 54. The lattice match between the encapsulation layer 56 and the semiconductor wafer 54 reduces the stress in the interface between the layer 56 and the surface 51 of the wafer 54. Such stress may cause damage to the surface 51, which may result in an undesired reduction of the resistivity of the surface 51. Accordingly for example, the ZnS layer 56 is used for the encapsulation of the CZT wafer 54 as the lattice constant of each is similar and a close match. To further reduce the stress between the CZT wafer 54 and the encapsulation ZnS layer 56, the encapsulation layer 56 may be formed with a thickness that allows the encapsulation layer 56 to be stretched along the surface 51 to reduce the stress in the interface between the layer 56 and the surface 51 of the CZT wafer 54. For example, in the process illustrated by FIG. 5, the thickness of the ZnS layer 56 on the CZT wafer 54 may be about 0.17 µm. However, other thicknesses may be used.

Figure 6:
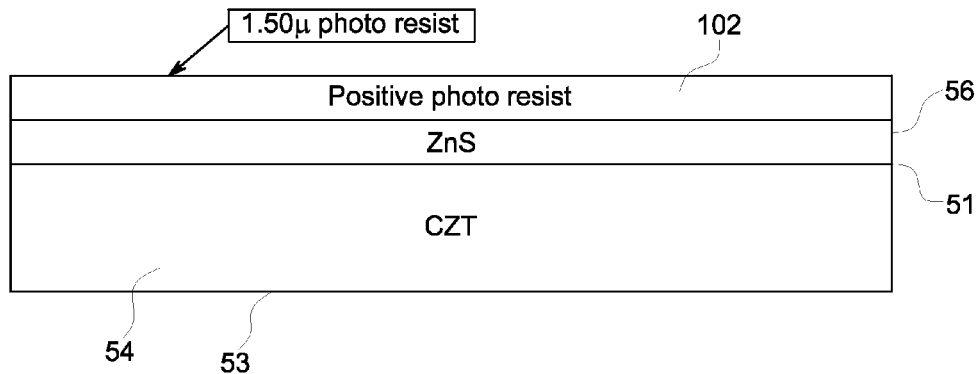

FIG. 6 is schematic illustration of the third step in fabricating the detector 100. In this step, a photoresist layer 102 is applied on top of the encapsulation layer 56 to form a patterned photoresist layer using UV irradiation through a patterning mask. The photoresist layer 102 may be of a positive or negative type and generally has good adhesion to the layer 56. The thickness of the photoresist layer 102 is thin enough in various embodiments to allow patterning of the layer and thick enough to ensure effective liftoff process in another processing step as is described below in connection with FIG. 12. For example, FIG. 6 illustrates the photoresist layer 102 as being of a positive type with thickness of 1.5 µm, which is spread over the layer 56 using a spinner to spin the wafer 54. However, other thickness may be used.

Figure 7:
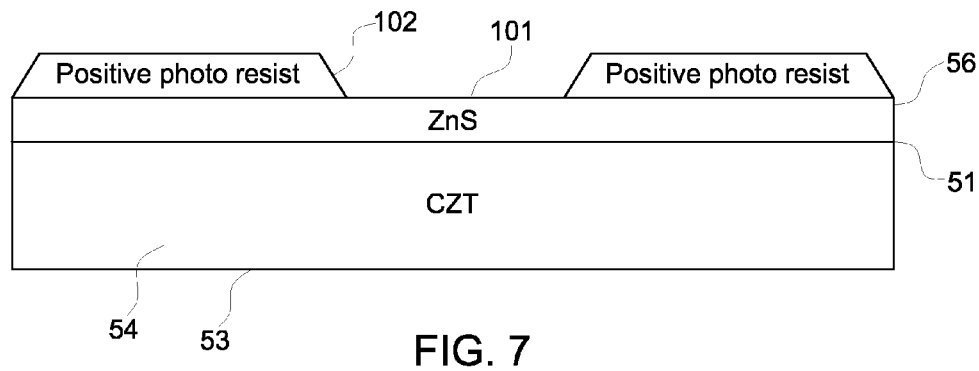

FIG. 7 schematically illustrates the fourth step in fabricating the detector 100. After the third fabrication step of the detector 100 and prior to this fabrication, the photoresist layer 102 is exposed to patterned UV illumination via a patterning mask using, for example, a suitable mask-aligner system and is backed in a furnace to produce soft backing of the photoresist layer 102. In the fourth fabrication step illustrated by FIG. 7, the photoresist layer 102 is developed and parts of the photoresist layer 102 are removed according to the patterned UV illumination of the layer 102 in the mask-aligner system using photolithography techniques to form openings 101 in the photoresist layer 102 above the encapsulation layer 56. After this step, the photoresist layer 102 is hardly backed making the photoresist layer 102 resistible to acids.

Figure 8:
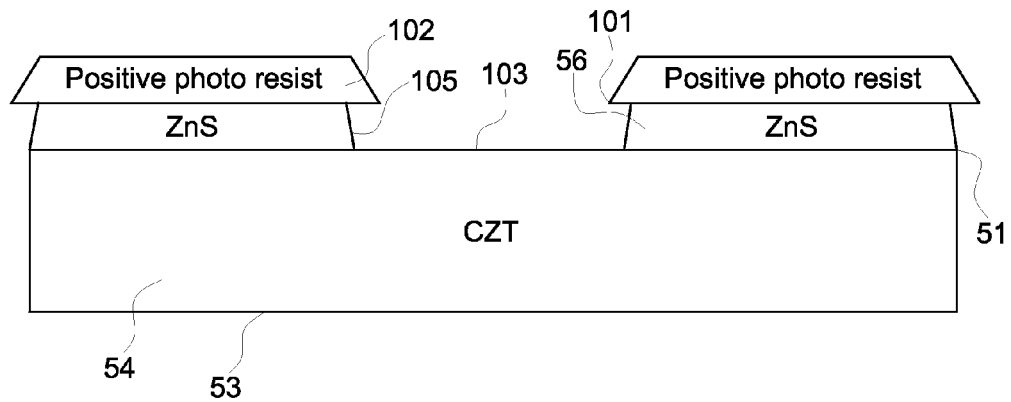

FIG. 8 is a schematic illustration of the fifth fabrication step of the detector 100. In this step, the encapsulation layer 56 is etched via the openings 101 in the photoresist layer 102 to form openings 103 in the encapsulation layer 56. The etching of the layer 56 may be performed, for example, by a dry-etch process, such as ion-milling or by chemical wet etch. When wet chemical etching is used to produce the openings 103 in the layer 56, in various embodiments a selective etchant that etches only the layer 56 and substantially does not etch the semiconductor 54 or etch the semiconductor wafer 54 very slowly is used. In this case, the surface 51 of the semiconductor wafer 54 is a stop etch surface where the etching stops. In this embodiment, the etching of the layer 56 may be better controlled and the wafer 54 is substantially not etched.

For example, when the wafer 54 is a CZT wafer and the encapsulation layer 56 is made of ZnS, the selective etchant used to etch the layer 56, via the openings 101, to form the openings 103 in the encapsulation layer 56 in one embodiment is HCl. During the formation of the openings 103 in the ZnS layer 56, the CZT wafer 54 is not etched and the undercut 105 in the encapsulation layer 56 is formed under the photoresist layer 102.

Figure 9:
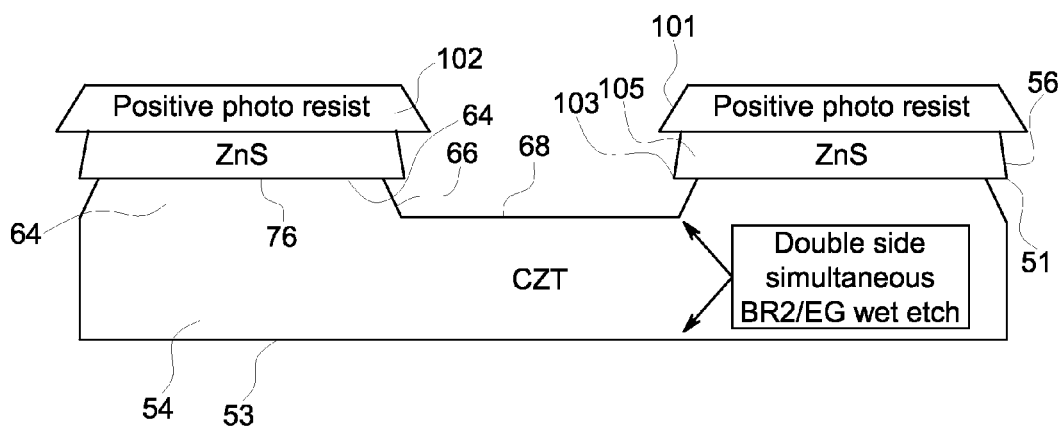

FIG. 9 schematically illustrates the sixth fabrication step used to produce the detector 100. In this fabrication step the semiconductor wafer 54 is etched, via the openings 101 in the photoresist 102 and the openings 103 in the encapsulation layer 56 to produce the etched regions 68 having the undercuts 66 under the encapsulation layer 56. In one embodiment, a selective etchant is used that does not attack the photoresist layer 102 and does not etch the encapsulation layer 56. Accordingly, the etching of the wafer 54 may be more controlled and accurate. For example, when the wafer 54 is made of CZT, the layer 102 is made of a photoresist and the layer 56 is made of ZnS, the selective etchant may be Bromine Methanol, $Br_2HBr$ or Bromine Ethylene Glycol, which etch the CZT wafer and do not attack the layers 102 and 56.

Figure 11:
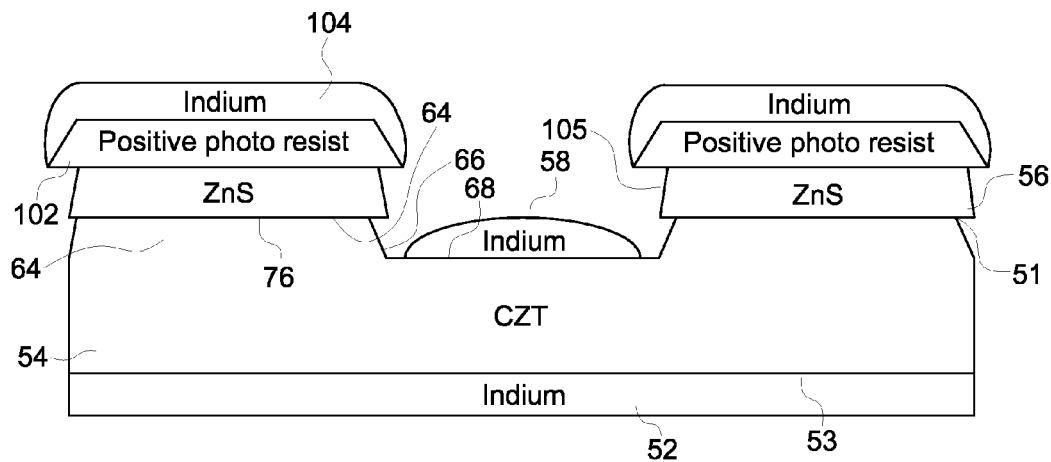

As described above in connection with FIGS. 1 and 2, the chemical wet etching of the surfaces 68 of detector 100, as shown in FIG. 9, is performed for creating the non-stoichiometric surface 68 of the semiconductor wafer 54 under the anodes 58 and the cathode 52 (as shown in FIG. 11) having excess of one of the components of the semiconductor 54. For example, such excess of Te is created when the semiconductor 54 is a CZT semiconductor and is chemically etched by Bromine Methanol or Bromine Ethylene Glycol. This non-stoichiometric surface with the excess of one of the elements of the semiconductor 54 improves the quality of the electrical contacts of the anodes 58 and the cathode 52 (shown in FIG. 11) to the semiconductor 54.

The regions 68 of the surface 51 and the surface 53 under cathode 52 are etched from the wafer 54. The surface 53 on which the cathode 52 is formed (shown in FIG. 11), may be etched simultaneously with the surface 51 or at a later fabrication step (e.g., sequentially or concurrently)

Figure 12:
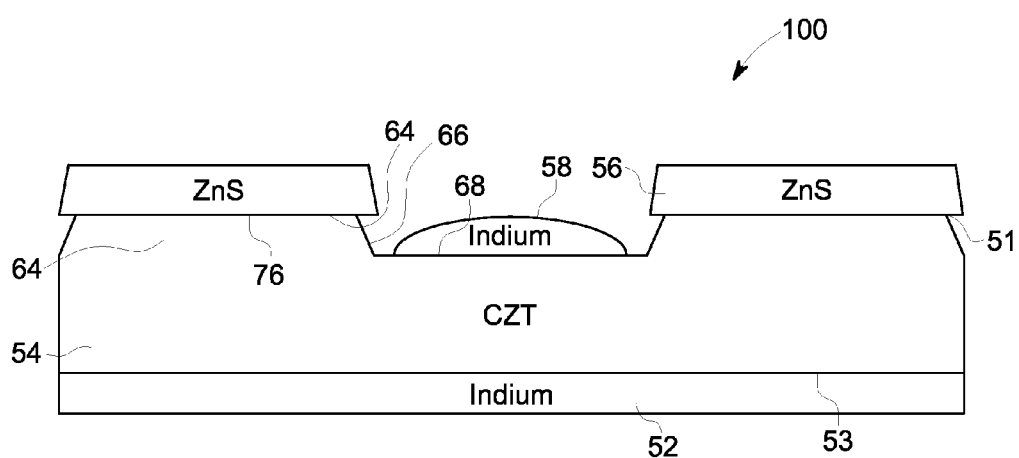

The surfaces 68 of the semiconductor 54 under the anodes 58 of the detector 100 are chemically etched via the openings 103 in the layer 56 to form the undercut regions 66, under the layer 56. As described below, with respect to the fabrication process, the undercut regions 66 at the edges of the regions 68 allow for a liftoff process used in the fabrication of the detector 100 as shown in FIGS. 11 and 12.

The partial etch of the regions 68 from the surface 51 of the wafer 54 is done only via the openings 101 and 103 of the layers 102 and 56, respectively in various embodiments. In these embodiments, the surfaces 76 on the gaps 64 between the regions 68 are left without chemical wet etching and thus have a surface resistivity corresponding to the gentle non-standard mechanical polish of the surfaces 76, which is similar to the resistivity of the bulk of the wafer 54.

Figure 10:
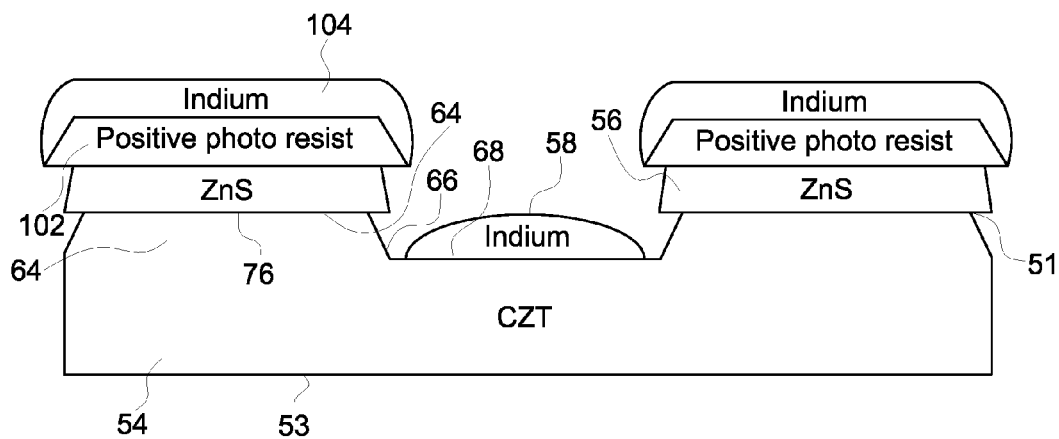

FIG. 10 is a schematic illustration of the seventh fabrication step of the detector 100. In this fabrication step, the anodes 58 are formed on the regions 68. Forming the metal contact of the anodes 58 may be done, for example, by metal evaporation using a heated crucible or e-gun, metal spattering, electroplating or electro-less processes, among others. As described above the metals used to form the anodes 58 may be In, Au, Pt, Al, among others, or a stack of layers including some or all of these metals. The type of metals used may determine whether the produced electrical contacts are Ohmic or blocking contacts.

For example, FIG. 10 shows the anodes 58 formed by evaporation of In all over the top surface of the CZT wafer 54. In one embodiment, the In layer 104 is formed on top of the photoresist layer 102 and the anodes 58 are formed on the etched regions 68. In this embodiment, the In anode contacts on the CZT wafer 54 create an electrical Ohmic contact.

It should be noted that the anodes 58 are part of In layer 104. It can be seen that the anodes 58 and the In layer 104 are not connected due to the undercut 105 (as shown in FIG. 9) of the layer 56 under the layer 102 and the undercut 66 of the wafer 54 under the layer 56. The discontinuity between the layer 104 and the anodes 58 is formed by the shadowing effect of the undercuts 105 and 66 that block the evaporation paths in the intervals between the layer 104 and the anodes 58. The existence of the undercuts 105 and 66 that produces the discontinuity between the In layer 104 and the anodes 58 is useful in the liftoff process as illustrated by FIGS. 11 and 12 and as described below.

FIG. 11 schematically illustrates the eight fabrication step of the detector 100. In this fabrication step, the cathode 52 is applied to the surface 53 of the semiconductor wafer 54. As described above, the cathode 52 may be applied to the etched surface 53 after the top and lower surfaces 51 and 53 are etched simultaneously or after the surfaces 51 and 53 are etched in different fabrication steps, such as the steps illustrated by FIGS. 9 and 11, respectively. The cathode 52 is applied on the surface 53 that, due to its chemical etching, is non-stoichiometric and is rich with one of the elements of the semiconductor 54 to improve the electrical contact of the cathode 52 to the surface 53 of the semiconductor wafer 54.

When the formation of the pixelated anodes 58 and the monolithic cathode 52 are produced by a metallization process including electroplating or electro-less, both the anodes 58 and the cathode 52 may be formed simultaneously on both sides of the wafer 54 in the top first surface 51 and the lower surface 53. If an evaporation process is used to form the pixelated anodes 58 and the monolithic cathode 52, the anodes 58 and the cathode 52 may be formed at different fabrication steps, such as the fabrication steps shown in FIGS. 10 and 11, respectively. For example, the application of the In cathode 52 shown in FIG. 11 is performed by an evaporation process. In the examples illustrated by FIGS. 10 and 11, the thickness of In layers of the anodes 58 and the cathode 52 in one embodiment may be about 0.34 μm. However, different thicknesses may be used.

FIG. 12 is a schematic illustration of the detector 100 having a structure similar to the detector 40 schematically illustrated in FIG. 1. FIG. 12 schematically illustrates the ninth fabrication step of the detector 100. In this fabrication step, the liftoff process is conducted to remove the In layer 104 (shown in FIG. 10) and the photoresist layer 102 from the encapsulation layer 56. During the liftoff process the photoresist layer 102 is exposed, for example, to Acetone that causes the layer 102 to be swollen first and later to be dissolved in the Acetone to be washed out together with the In layer 104. The efficiency of the liftoff process is increased due to the undercut 105 in the encapsulation layer 56 under the photoresist layer 102 and mainly due to the undercut 66 in the semiconductor 54 under the layer 56. These undercuts allow free access of the Acetone, via the discontinuity between the layer 104 and the anodes 58, to reach the photoresist layer 102 for being swollen and dissolved for removing the In layer 104. Thus, the creation of the undercuts 105 and 66 facilitate achieving an efficient liftoff process to assure fabrication of detector 100, such as with high production yield.

As described above, the discontinuity between the layer 104 and the anodes 58, which is used for the liftoff process, is formed by the shadowing effect of the undercuts 105 and 66 that block the evaporation paths in the intervals between the layer 104 and anodes 58. The existence of the undercuts 105 and 66 that produces the discontinuity between the In layer 104 and the anodes 58 facilitates the liftoff process as illustrated by FIGS. 11 and 12 as described above.

Figure 13:
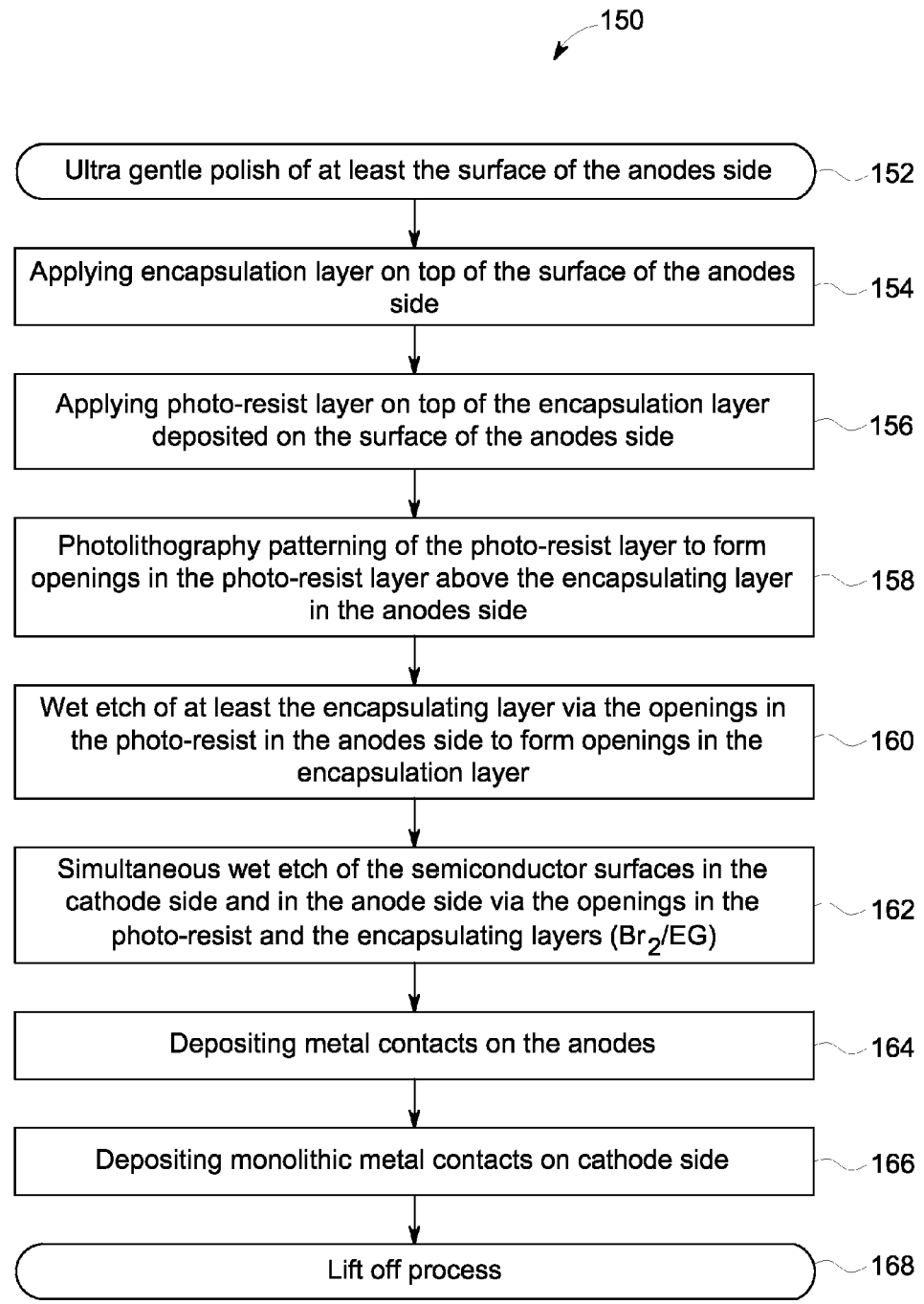
FIG. 13 is a flow chart of a method for fabricating radiation detectors in accordance with various embodiments.

FIG. 13 is a process flowchart illustrating and describing the processing steps in the fabrication sequence of a detector, for example, the detector 100 illustrated by FIGS. 4-12. The fabrication steps illustrated by FIGS. 4-12 (which in the illustrated embodiment include nine steps) correspond to the steps 152-168 illustrated by the flowchart 150 as described in more detail above. In general, a gentle polish at 152 is followed by the application of an encapsulation layer at 154 on the top of the surface of the anode side. A photoresist layer is applied at 156 on top of the encapsulation layer, which is deposited on the surface of the anode side. Photolithography patterning of the photoresist layer is then performed at 158 to form openings in the photoresist layer above the encapsulation layer in the anode side.

A wet etching of at least the encapsulation layer via the openings in the photoresist in the anode side is then performed at 160 to form openings in the encapsulation layer. A simultaneous or concurrent wet etch of the semiconductor surfaces in the cathode side and the anode side via the opening in the photoresist and the encapsulation layers is then performed at 162. Metal contacts are then deposited on the anodes at 164 and monolithic metal contacts are deposited in the cathode side at 166. A lift off process in the performed at 168.

Accordingly, by practicing various embodiments a detector may be fabricated with an efficient fabrication process due to a high production yield achieved. The formation of the undercuts 105 and 66 facilitate the fabrication process. The gentle non-standard polishing together with the partially etched top first surface 51 produce the gaps 64 having the high resistivity surfaces 76 with a resistivity similar to the resistivity of the bulk of the semiconductor 54 resulting in a higher performance radiation detector produced with high production yield at relatively low cost.

Variations and modifications are contemplated. For example, although the semiconductor 54 in various embodiments is described as being a CZT semiconductor, the semiconductor may be formed from any suitable material. Additionally, although the anodes 58 and the cathode 52 are described as made of In, the anodes 58 and the cathode 52 may be formed from any type of material, particularly any type of metal. Moreover, although the electrical contacts of the anodes 58 and the cathode 52 are described as Ohmic contacts, the electrical contacts may be other types of contacts, such as blocking contacts. Also, although the first and second surfaces 51 and 53 of the semiconductor 54 are described as being polished simultaneously in the same fabrication step, the first and second surfaces 51 and 53 may be polished at different fabrication steps, which may or may not be concurrent.

Additionally, although the anodes 58 and the cathode 52 are described as being produced in different fabrication steps, they may be formed simultaneously or currently at the same fabrication step. Further, although the grains in the slurry used in the last polishing steps are described in one embodiment as having a size of 0.05 µm, these grains may have any size, such as less than 0.1 µm. Also, the size of the grains of the slurry of the various polishing steps may have any size.

Thus, various embodiments provide methods for fabricating a radiation detector, such as a pixelated radiation detector without chemical etching to remove damaged layers. Accordingly, in various embodiments, no chemical etching is used between the anode contacts.

In other embodiments, methods for fabricating a radiation detector, such as a pixelated radiation detector, such as a pixelated semiconductor radiation-detector wherein the surface of the anodes is produced by a complete dry-process with no wet chemical etch, which may be active after the detector fabrication and may result in lower surface resistivity and detector performances that degrade less with time. In these methods the surface side of the anodes is not just encapsulated but, is also passivated, by a passivation process, which produces both encapsulation and surface stabilization that may result in high surface resistivity.

The methods described below to produce a pixelated semiconductor radiation-detector may be performed by a simple process which on the anodes side does not include any wet chemical etching, lift-off process, and may not include photolithography in some embodiments. The pixelated semiconductor radiation-detectors produced in accordance with various embodiments may have electrical rectifying anodes that are based on Metal-Oxide-Semiconductor (MOS) contacts having a strong tunneling effect. In some embodiments, the tunneling effect is produced by the creation of energy levels in the energy-gap of the passivation layer created by reactive ions or mechanical stress between the metal contacts of the anodes and the passivation layer.

It should be noted that pixelated semiconductor radiation-detectors fabricated in accordance with various embodiments may have blocking-diode anodes contacts made of metals, such as Indium or Platinum, which are either not otherwise suitable to produce blocking contacts on Cadmium-Zinc-Tellurium (CZT) semiconductors or produce, on a CZT material, Schottky contacts. The pixelated semiconductor radiation-detectors may have electrical rectifying anodes and a steering grid with low leakage current between the steering grid and the anodes.

Figure 14:
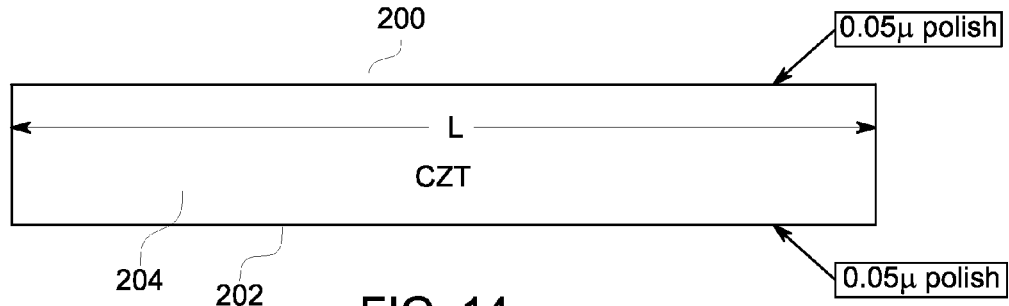
FIGS. 14-20 are diagrams illustrating the fabrication steps involved in the production of radiation detectors according to other various embodiments.

In various embodiments a dry fabrication process may be provided as illustrated in FIGS. 14-20, for example, to fabricate pixelated radiation-detector as is described below. In particular, FIG. 14 illustrates the first processing step of producing a radiation detector. It should be noted that the illustration of FIG. 4 is similar to that illustrated by FIG. 14. Accordingly, the description above for FIG. 4 will not be repeated here and it should be appreciated that the surfaces 200 and 202, and the semiconductor 204, of FIG. 14 correspond to the surfaces 51 and 53, and the semiconductor 54, of FIG. 4, respectively.

Figure 15:
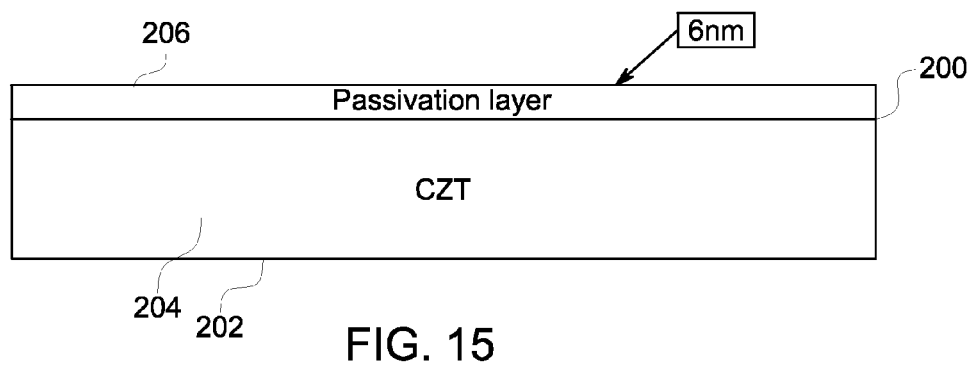

FIG. 15 shows the formation of a passivation layer 206 grown on the surface 200 of the semiconductor 204 that may be made, for example, of a CZT semiconductor. The passivation layer 206 may be formed by growing the passivation layer 206 on top of the semiconductor 204 in one embodiment using a plasma process that may include:

1. Cleaning the surface 200 by using plasma of mixture of gases such as, Methane, Argon and Hydrogen to clean the surface 200 from any residual of metallic contamination by creating volatility components that are pumped out from the chamber where the semiconductor wafer 204 is placed. The mixture of gases, at a pressure of less than 1 mTorr is purged into the chamber where the semiconductor 204 is placed and the plasma of the mixture of gasses is created by ionizing process including irradiating the mixture of gases with microwave radiation at a power of about 100 Watt and a frequency of 13.56 MHz.

2. Growing the passivation layer 206 by a flow of oxygen plasma at a pressure of about 0.3-0.5 mTorr at a flow rate of about 2 standard cubic centimeters per minute (seem). The plasma of the oxygen is created by an ionizing process including irradiating the oxygen gas by microwave radiation at a power of about 100 Watt and frequency of 13.56 MHz. In the initial process of growing the passivation layer 206, the residual of organic materials left after the plasma cleaning process, described above, and residuals produced during the plasma cleaning process due to dissociation of the methane gas, such as carbon, are removed by burning and pumping out of the chamber.

The thickness of the passivation layer 206 in some embodiments is about 3-6 nanometers (nm). It should be noted that the thickness of the passivation layer 206, under the conditions described above, increases with the plasma processing time until reaching a saturated thickness value of about 6 nm after 10 minutes.

In the case of the CZT semiconductor 204, the passivation layer 206 includes Tellurium dioxide ($TeO_2$) wherein the fraction thereof in the passivated oxide layer (namely the passivation layer 206) depends on surface preparation and the plasma cleaning conditions, such as the plasma cleaning time and type of gases used in this process.

It should be noted that the passivation layer 206 is also an encapsulation layer that protects the surface 200 on which this layer is grown to form a high resistance surface having resistivity that is similar to the resistivity of the semiconductor bulk.

Figure 16:
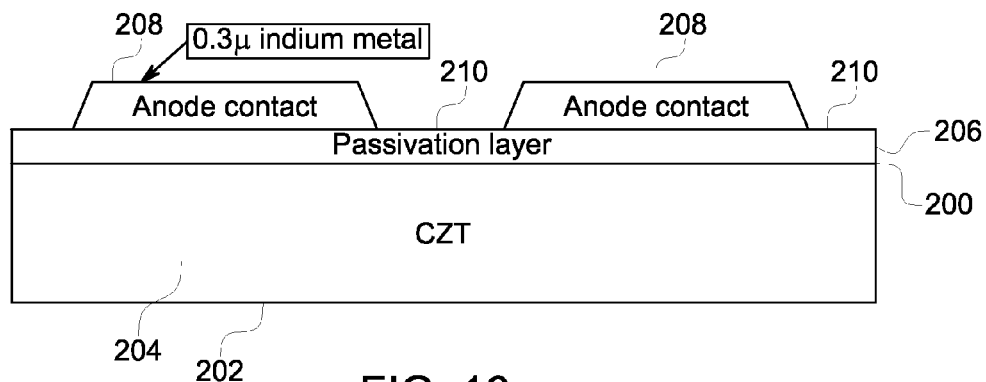

FIG. 16 schematically illustrates the step of the application of metal contacts on top of the passivation layer 206 to form anodes 208 with gaps 210 between the anodes 208, which are not coated with metal. The gaps 210 with the grown encapsulation and passivation layer 206 have a high surface resistance for high performance radiation-detectors (as illustrated by FIG. 3 and described above) and are sealed (encapsulated) for stable, reliable and non-degraded detectors. A semiconductor, such as the semiconductor 204, on which a passivation oxide layer, such as the passivation layer 206, is grown has high surface resistance that may be equal to the resistance of the bulk material. In addition, the passivation layer 206 is chemically inactive and thus very stable and suitable for producing radiation-detectors that do not degrade with time or have a reduced likelihood of degrading over time.

Figure 23:
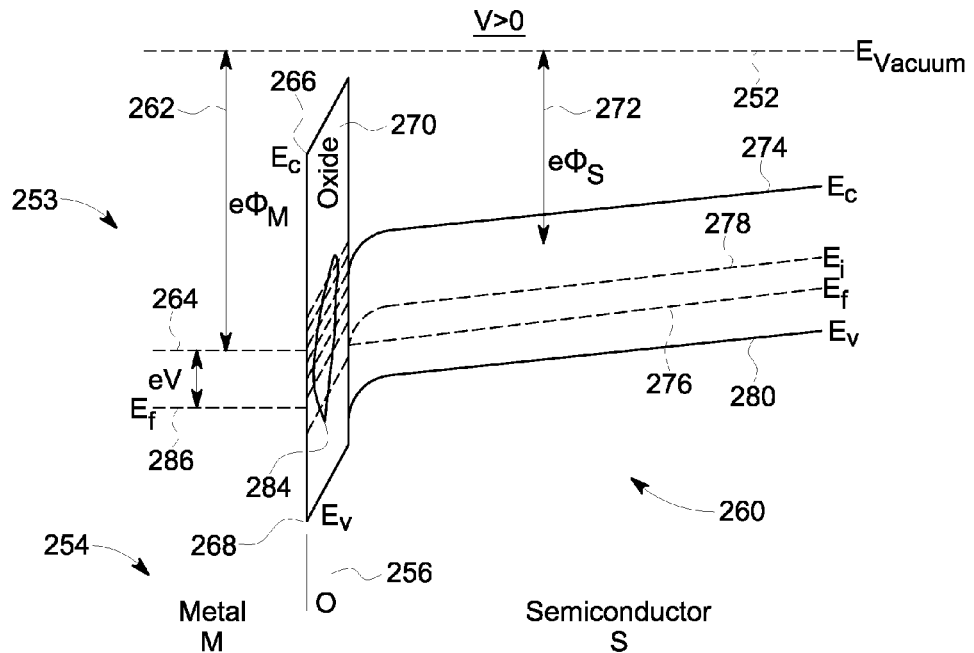

The anodes 208 may be produced by a photolithography technique in some embodiments. However, in other embodiments, the anodes 208 are formed by metal evaporation, in a vacuum chamber, through a shadowing mask. In one embodiment the anodes 208 have a thickness of about 0.3 µm. However, the anodes 208 can be formed to have different thickness. The anodes 208 in various embodiments are formed from metals that are either reactive metals, such as Indium and Aluminum or rigid metals, such as Nickel and Platinum. In both types of the metals, energy levels are created in the energy-band of the passivated layer 206 to increase the tunneling effect of electrons passing through passivation layer 206 from the semiconductor 204 to the metal contacts, as is shown in FIG. 23 for metal 254 and semiconductor 260 as described below.

Figure 17:
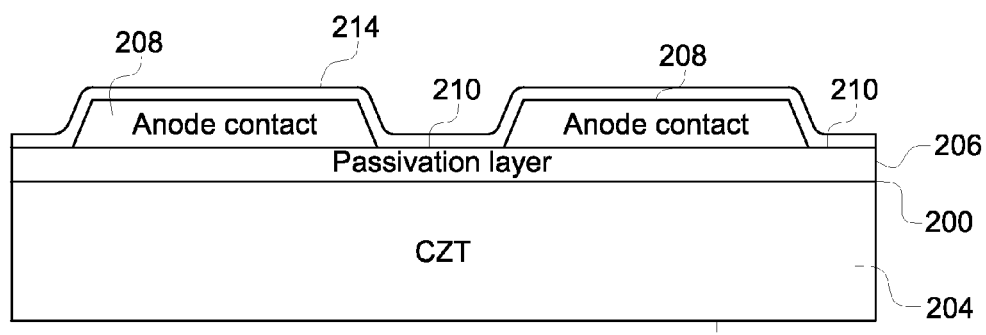

FIG. 17 schematically illustrates a protection step for the anodes 208 by applying a protective layer 214 on top of the anodes 208. The protective layer 214 may be, for example, an adhesive tape or other type of materials, such as photoresist or resist formed on the anodes 208 and the surface of the passivation layer 206 in the regions of gaps 210. This protective layer 214 protects the anode surface during the next step when the surface 202 of the semiconductor 204 is treated by etching.

Figure 18:
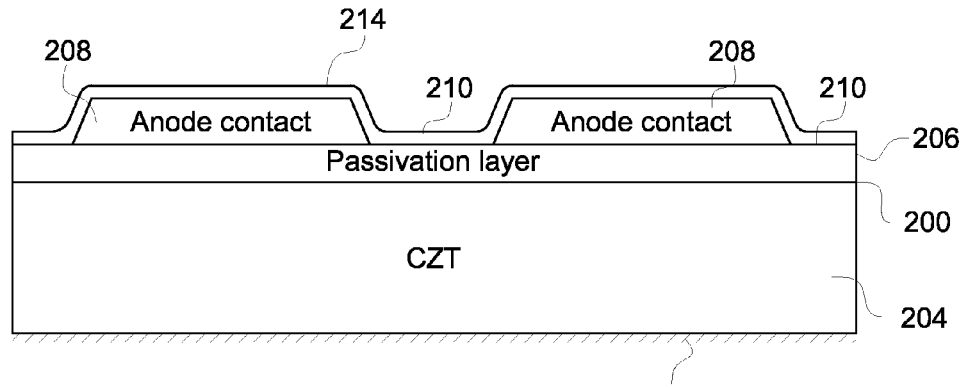

FIG. 18 schematically illustrates a preparation processing step for the surface 202, which prepares the surface 202 for the application of a monolithic cathode contact 212 (of FIG. 19) on top of the surface 202 of the semiconductor 204 while the anodes surface is protected by the protective layer 214. The surface 202 may be etched by chemical wet etching.

When the semiconductor 204 is made of CZT, this process may include etching with Brome Methanol or Brome Ethylene Glycol or may include dry etching such as ion etching.

Figure 19:
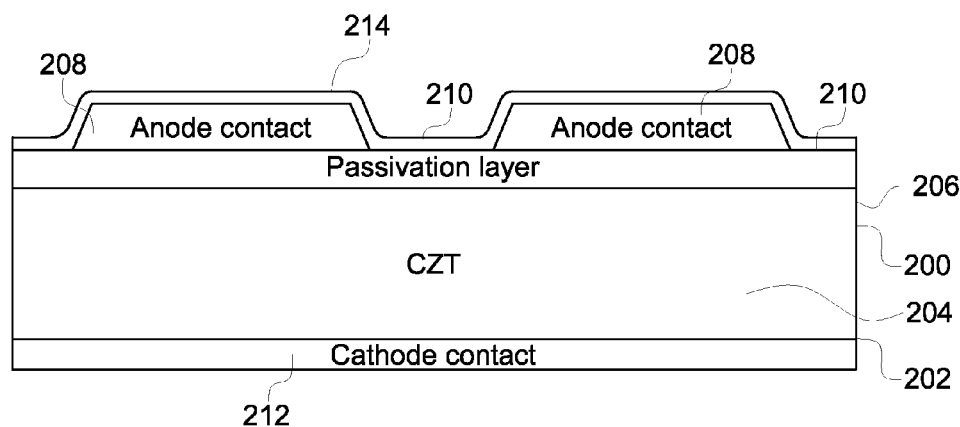

FIG. 19 schematically illustrates the application of a cathode contact 212 on the etched surface 202 while the protective layer 214 still protects the anodes surface. The cathode 212 may be produced, for example, by metal evaporation, electroplating, electro-less or spraying process. The cathode 212 may be of different types, such as an Ohmic, blocking or rectifying contact depending on the type of etching and metal used to form cathode contact 212.

Figure 20:
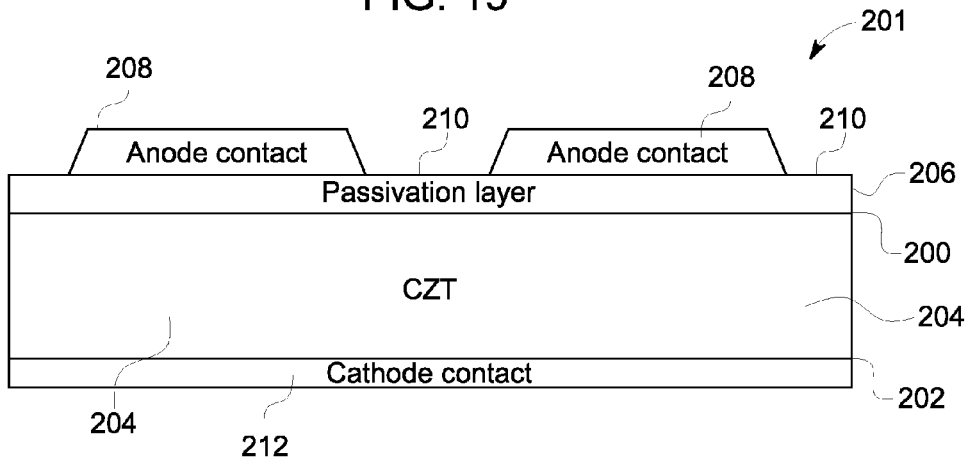

FIG. 20 schematically illustrates the final step in producing the pixelated radiation-detector 201, which includes the removal of the protective layers 214 and cleaning the anodes surface. The cleaning process may include soaking the semiconductor 204 in solvents, such as acetone and methanol and drying using isopropanol and flow of dry nitrogen or dry air.

Figure 21:
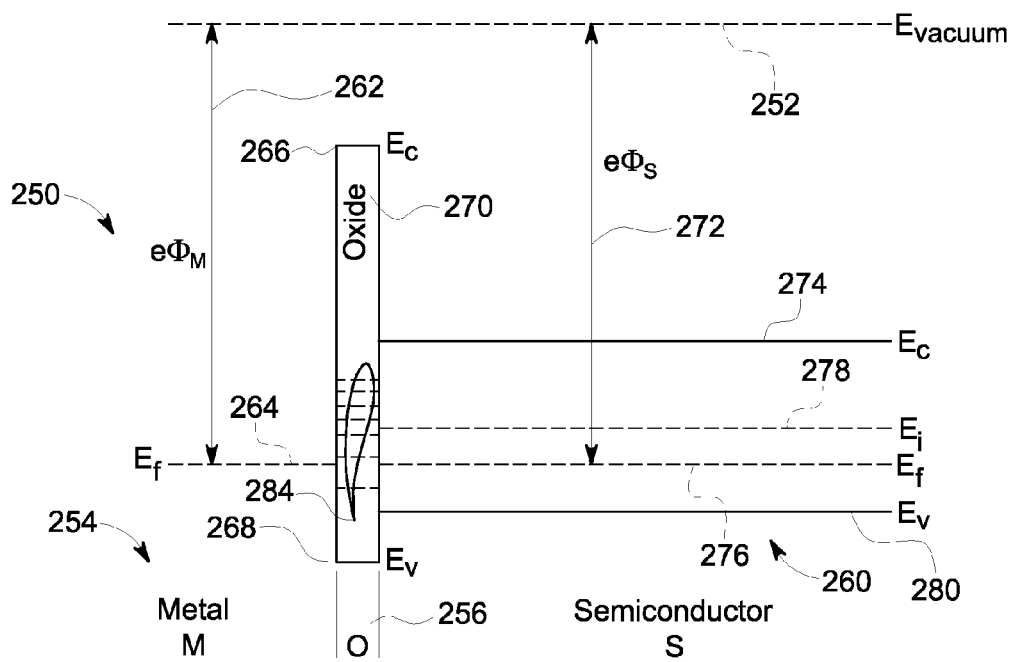
FIGS. 21-23 are graphs illustrating energy bands in accordance with various embodiments.

The operation or behavior of a Metal-Oxide-Semiconductor (MOS) contact having inter-band energy levels in the band gap of the oxide region will now be described. FIG. 21 schematically illustrates an energy-band diagram 250 of metallic anode contacts 254, such as the anodes 208 shown in FIG. 20, placed on top of the oxide passivation layer 256, such as the layer 206 of FIG. 20, grown on top of the semiconductor 260, such as the semiconductor 204 of FIG. 20. This configuration is equivalent to a MOS structure.

FIG. 21 shows the energy-bands diagram of an unbiased MOS contact structure, according to one embodiment, including a metallic region, namely the metallic anode contacts 254, an oxide region, namely the oxide passivation layer 256 that includes a passivation oxide layer 270 and the semiconductor region 260, which correspond to the metallic anodes 208, passivation layer 206 and P-type semiconductor 204 of FIG. 20.

The metallic region 254 has a Fermi-level 264. The oxide region 256 has a valence-band energy 268 and a conductive-band energy 266. The semiconductor region 260 has a valence-band energy 280, intrinsic Fermi-level 278, quasi Fermi-level 276 and conductive-band energy 274. The vicinity or location of the quasi Fermi-level 276 to the valence-band 280 indicates that the semiconductor 260 is of a P-Type.

The energy difference between the metallic Fermi-level 264 of the metal 254 and the vacuum level 252 is illustrated by the arrows 262 and is equal to $e\Phi_M$ when e is the electron charge and $\Phi_M$ is the work-function of the metal. Similarly, the energy difference between the quasi Fermi-level 276 of the semiconductor 260 and the vacuum level 252 is illustrated by the arrows 272 and is equal to $e\Phi_S$ when e is the electron charge and $\Phi_S$ is the work-function of the semiconductor.

Figure 22:
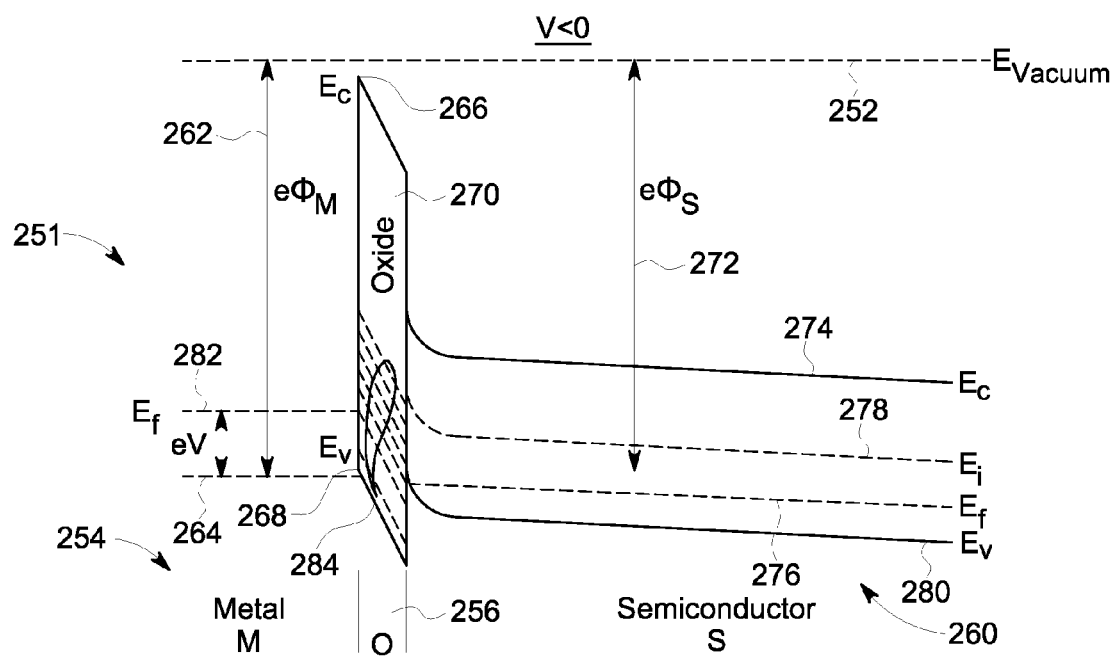

For the simplicity of the drawings and the explanations of FIGS. 21-23, work functions $\Phi_M$ of the metal 254 and the work function $\Phi_S$ of the semiconductor 260 are illustrated as being substantially equal, but may be different in some embodiments.

The MOS structure of the anodes 208 of FIG. 20 is different from the standard MOS contacts includes the presence of multiple energy-levels 284 in the forbidden band-gap of the oxide passivation layer 270. The influence of creating multiple energy levels 284 on the MOS contact will be described first with reference to FIGS. 21-23. This description will be followed by a description of the creation of the energy-levels 284.

FIG. 22 schematically illustrates the energy-band diagram 251 of the metallic anode contacts 254, such as the anodes 208 of FIG. 20, having a MOS configuration under the condition of forward bias, i.e. the metallic region is biased negatively with respect to the semiconductor, which is equivalent to the bias of the anodes 208 negatively with respect to cathode 212 of FIG. 20. Under this bias, the Fermi-level 264 of the metal 254 (the anode 208 of FIG. 20) moves up by the amount eV, to appear as the Fermi-level 282, when V is the applied bias between the metal 254 and the semiconductor 260. Under the same bias, the inter-band energy-levels 284 have a gradient which is proportional to the electrical field in the passivation layer 270. The conductive-band 274, valence-band 280 and intrinsic Fermi-level 278 of the semiconductor 160 are all curved near the interface with the passivation layer 270 due to the depletion process of electrons in the conductive-band 274 and the inversion process of holes in the valence-band 280 of the P-type semiconductor 260, produced by the negatively biased anode 254 (the anodes 208 of FIG. 20). In addition, the conductive-band 274, valence-band 280 and intrinsic Fermi-level 278 of the semiconductor 260 all have a gradient that is proportional to the electrical field in the semiconductor 260. The energy-levels 284 in the forbidden bang-gap of the passivation layer 270 also have a gradient that is proportional to the electrical field in the oxide region 256.

The energy-levels 284 in the forbidden bang-gap of the passivation layer 270 may increase the tunneling effect to increase the transition of the majority charge-carriers, which are holes, from the valence-band 280 of the P-type semiconductor 260 to the metal 254 via the oxide 256. Accordingly, under the bias when the metal 254 (the anode 208 of FIG. 20) is negative relative to the semiconductor 260 (the cathode 212 of FIG. 20), the MOS contact has high conductivity via the inter-band energy-levels 284 in the forbidden band-gap of the passivation layer 270 (the layer 206 of FIG. 20). Without the existence of the energy-levels 284, the electrical current between the semiconductor 260 and the metal 254 via the insulation oxide layer 270 would be limited to the quantum tunneling via the barrier layer 270 and thus, would be very low and inversely proportional to the exponential value of the thickness of oxide 256 (insulator). Accordingly, the MOS contact with the inter-levels 284, with the energy-band structure 251 illustrated by FIG. 22, has high conductivity (low resistance) and behaves like a rectifying contact under forward bias.

FIG. 23 schematically illustrates the energy-band diagram 253 of the metallic anode contacts 254 (the anodes 208 of FIG. 20) having the MOS configuration under the condition of reverse bias, i.e. the metallic region is biased positively with respect to the semiconductor, which is equivalent to the bias of the anodes 208 positively with respect to the cathode 212 of FIG. 20. Under this bias, the Fermi-level 264 of the metal 254 (the anode 208 of FIG. 20) moves down by the amount eV, to appear as the Fermi-level 286, when V is the applied bias between the metal 254 and the semiconductor 260 and the energy-levels 284 have a gradient which is proportional to the electrical field in the passivation layer 270. The conductive-band 274, valence-band 280 and intrinsic Fermi-level 278 of the semiconductor 260 are all curved down near the interface with the passivation layer 270 due to the inversion process of electrons in the conductive-band 274 and depletion process of holes in the valence-band 280 of the P-type semiconductor 260, produced by the positively biased anode 254 (the anodes 208 of FIG. 20). In addition, the conductive-band 274, valence-band 280 and intrinsic Fermi-level 278 of the semiconductor 160 all have a gradient that is proportional to the electrical field in the semiconductor 260. The energy-levels 284 in the forbidden band-gap of the passivation layer 270 also have a gradient that is proportional to the electrical field in oxide region 256.

The location of the energy-levels 284 and the orientation of the corresponding gradients in the forbidden bang-gap of the passivation layer 270 do not contribute to increase the tunneling effect of the transition of the majority charge-carriers, which are holes, from the valence-band 280 of the P-type semiconductor 260 to the metal 254 via the oxide 256. In this case, the energy-levels 284 do not enhance the tunneling process since the location of the energy-levels 284 and alignment do not allow the energy-levels 284 to produce electrical paths through which holes can pass from semiconductor the 260 to the metal 254.

Accordingly, under the bias when the metal 254 (the anode 208 of FIG. 20) is positive relative to the semiconductor 260 (the cathode 212 of FIG. 20), the MOS contact has high resistance characterized mainly by the resistance of the insulative oxide layer 270 (the layer 206 of FIG. 20) and the small quantum tunneling of holes via the barrier 270. Without the contribution of the inter-band energy-levels 284 to the tunneling process, the electrical current between the semiconductor 260 and the metal 254 via the insulation oxide layer 270 is limited to the quantum tunneling via the barrier layer 270 and thus, is very low and inversely proportional to the exponential value of the thickness of the oxide 256 (insulator). Accordingly, the MOS contact with the inter-levels 284, with the energy-band structure 253 illustrated by FIG. 23 behaves like a rectifying blocking contact.

From the description above for FIGS. 21-23, it is clear that due to the inter-band energy-levels 284 in the oxide region 270, the anodes 208 of FIG. 20, having a MOS configuration similar to the one illustrated by FIGS. 21-23, behave like rectifying contacts having operation modes of forward-bias (low resistance) and reverse-bias (high resistance or blocking contact) as described above and illustrated by FIGS. 22 and 23, respectively.

Figure 24:
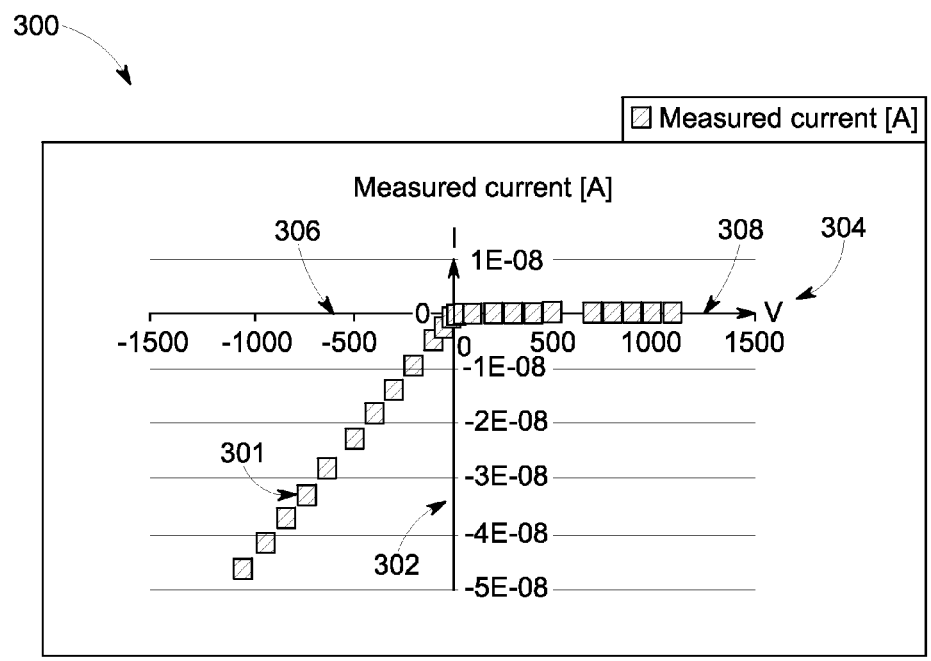
FIG. 24 is a graph of a current-voltage curve in accordance with various embodiments.

FIG. 24 is a graph 300 showing a Current-Voltage (I-V) curve 301 measured on the CZT detector 201 of FIG. 20. The measured current is the current that flows into the anode 208 from the semiconductor 204 via the passivation layer 206 as a function of the voltage applied between the anode 208 and the cathode 212 of FIG. 20 corresponding to the measurement of the current that flows into the metal 254 from the semiconductor 260 via the passivation layer 270 as a function of the voltage applied between the metal 254 and the semiconductor 260 of FIGS. 22 and 23, respectively. The values of the measured current flows in the anodes 208 in Ampere units [A] are marked along the Y-axis 302 of the graph 300 and the values of the measured voltage between the anode 208 and the cathode 212 in Volts units [V] along the X-axis 304 of graph 300.

The negative values of the voltage between the anode 208 and the cathode 212 appear in the negative part 306 of the X-axis of the graph 300. This region corresponds to the situation illustrated by FIG. 22 in which the MOS contact is in forward-bias due to the tunneling enhanced by the inter-band energy-levels 284 in the passivation oxide layer 206 of FIG. 20 (the oxide layer 270 of FIG. 22), resulting under these bias conditions, in an electrical conducting contact. The positive values of the voltage between the anode 208 and the cathode 212 appear in the positive part 308 of the X-axis of the graph 300. This region corresponds to the situation illustrated by FIG. 23 in which the MOS contact is in reverse-bias (blocking state) since, in this situation, the inter-band energy-levels 284 do not contribute to the enhancement of the tunneling in the passivation layer 206 of FIG. 20 (the layer 270 of FIG. 23) due to the position and the orientation of the corresponding gradient, resulting, under these bias conditions, in a high resistance electrically blocking contact.

From the graph 300, it can be seen that the anode contact 208 behaves as a rectifying contact having forward and reverse bias, which is different from conventional MOS contacts that behave like a blocking contact, in both directions, for any applied bias and polarity.

Figure 25:
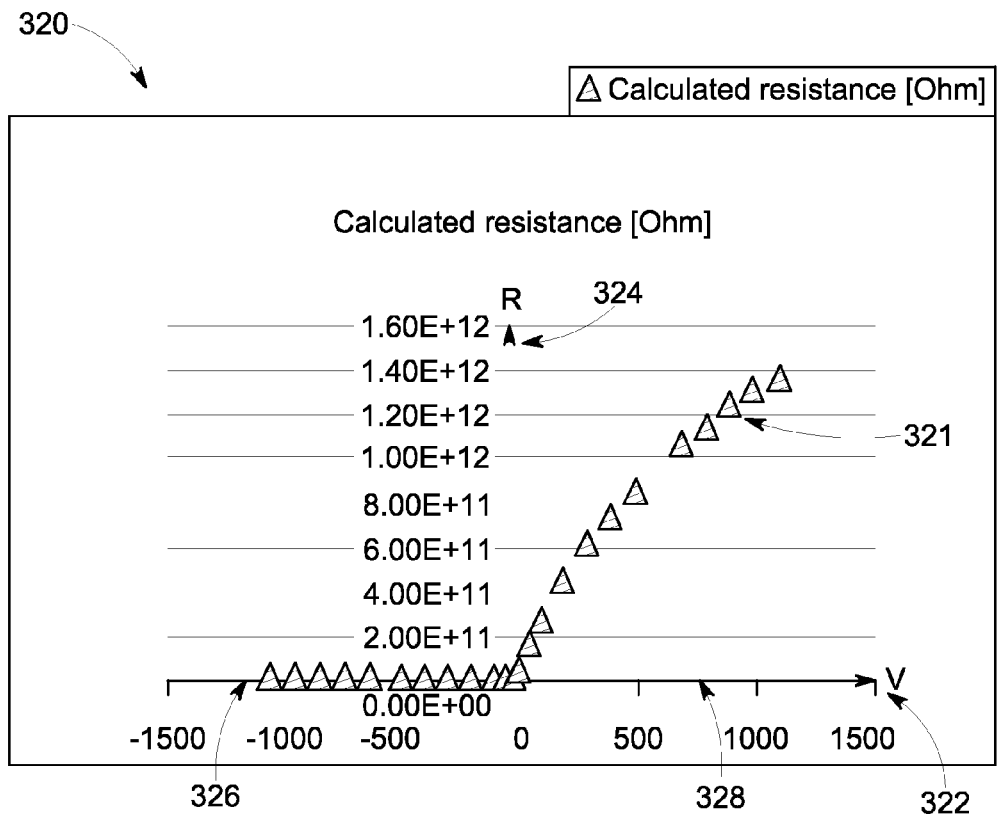
FIG. 25 is a graph of a resistance curve in accordance with various embodiments.

FIG. 25 is a graph 320 showing the resistance curve 321 as measured on the CZT detector 201 of FIG. 20. The measured resistance is the resistance between the anode 208 and the cathode 212 of FIG. 20 measured as a function of the voltage applied between the anode 208 and the cathode 212 of FIG. 20 corresponding to the resistance between the metal 254 and the semiconductor 260 via the passivation layer 270 as a function of the voltage applied between the metal 254 and the semiconductor 260 of FIGS. 22 and 23, respectively. The values of the measured resistance between the anodes 208 and the cathode 212 in Ohm units [Ω] are marked along the Y-axis 324 of the graph 320 and the values of the measured voltage between the anode 208 and the cathode 212 in Volts units [V] are marked along X-axis 322 of the graph 300.

The negative values of the voltage between the anode 208 and the cathode 212 appear in the negative part 326 of the X-axis of the graph 320. This region corresponds to the situation illustrated by FIG. 22 in which the MOS contact is in forward-bias due to the tunneling enhanced by the inter-band energy-levels 284 in the passivation oxide layer 206 of FIG. 20 (the oxide layer 270 of FIG. 22), resulting, under these bias conditions, in a fixed low-resistivity contact. The positive values of the voltage between the anode 208 and the cathode 212 appear in the positive part 328 of X-axis of the graph 320. This region corresponds to the situation illustrated by FIG. 23 in which the MOS contact is in reverse-bias (blocking state) since, in this situation, the inter-band energy-levels 284 do not contribute to the enhancement of the tunneling in the passivation layer 206 of FIG. 20 (the layer 270 of FIG. 23) due to the position and the orientation of the corresponding gradient, resulting, under these bias conditions, in a high resistance electrically blocking contact.

From the graph 320, it can be seen that the anode contact 208 behaves as a rectifying contact, which is different from a conventional MOS contact. The resistance of the anode blocking-contact 208 may reach values that are several orders higher than the bulk resistance of the CZT semiconductor, which cannot be provided in CZT detectors when using Schottky blocking contacts.

The fixed value of the resistance of anode contact 208 under forward-bias indicates that the density and uniformity of Inter-band energy-levels 284 are high thus, substantially the same enhanced tunneling is produced by Inter-band energy-levels 284 for each applied forward-bias, resulting in low fixed resistance of anodes 208 under forward-bias.

From the above description it is clear that due to the unique formation of the inter-band energy-levels 284 in the oxide region 206 of FIG. 20 (corresponding to the passivation layer 270 of FIGS. 21-23), the anodes 208 of FIG. 20 (corresponding to the metal 254 of FIGS. 21-23) behave in a unique way that is different than the behavior of conventional OMS and Schottky contacts.

The formation of interbank energy levels in the oxide region will now be described. The fabrication of the anodes 208 on the CZT detector 201 of FIG. 20 and the formation of the inter-band energy-levels 284 of FIGS. 21-23 may be accomplished, for example, by an evaporation process using several types of metals applied on the passivation layer 206 produced, by plasma method, on the CZT detector 201 of FIG. 20, as follows:
1. High purity (five $9^{th}$) Indium (In) (reactive metal thus penetrates into the passivation layer)
2. Lower purity (three $9^{th}$) Indium (In) (Metal having low reactivity due to the low purity thus, does not penetrate into the passivation layer, this metal is also soft and thus does not produce mechanical stress on the passivation layer)
3. Platinum (Pt) (stiff and rigid metal thus, produces mechanical stress on the passivation layer, this metal is also non-reactive thus, does not penetrate into the passivation layer)
4. Gold (Au) (soft metal and thus, does not, produce mechanical stress on the passivation layer, this metal is also non-reactive, thus, does not penetrate to the passivation layer)

The inter-band energy-levels 284 in the oxide layer 206 of FIG. 20 (the oxide layer 270 of FIGS. 21-23) may be produced by:
1. Mechanical Stress between stiff metal contacts 208 and oxide layer 206, which produces local-damage in oxide layer 206 results with the formation of the inter-band energy-levels 284 in the forbidden-gap of the oxide layer 206.
2. Doping of the oxide layer by the reactive metal contact 208 having a portion thereof reactively diffuse into the oxide layer 206, as a doping material, to produce the inter-band energy-levels 284 in the forbidden-gap of the oxide layer 206.
   (a) When high-purity Indium (five $9^{th}$) is evaporated to produce anodes 208, these anodes may be been made from soft metal which do not produce the amount of stress, between the Indium contact 208 and the passivation oxide layer 206, used to create the inter-band energy-levels 284 by mechanical stress that creates the local damage in the oxide layer 206. However, the high-purity Indium from which the nodes 208 are made of, is a very reactive metal and has the other property used to produce inter-band energy-levels 284 by at least partially penetrating into the oxide layer 206, in a diffusion process, to serve as a dopant which creates the levels 284. Accordingly, the anodes 208 produced by evaporation of high purity Indium on the CZT passivation layer 206, exhibits the electrical behavior, of rectifying contacts, shown in the graphs 300 and 320 of FIGS. 24 and 25, respectively, and are suitable to produce high yield high performances CZT detectors.
   (b) When lower-purity Indium (three $9^{th}$) is evaporated to produce the anodes 208, these anodes have may be made from soft metal which do not produce the amount of stress, between the Indium and the passivation oxide layer 206, used to create the inter-band energy-levels 284 by mechanical stress that creates the local damage in the oxide layer 206. In addition, the metal of lower-purity Indium is not reactive enough to produce the inter-band energy-levels 284 by at least partially penetrating into the oxide layer 206, in a diffusion process, to serve as a dopant which creates the levels 284. Accordingly, the anodes 208 produced by evaporation of lower purity Indium on the CZT passivation layer 206 do not exhibit the electrical behavior of rectifying contacts, shown in the graphs 300 and 320 of FIGS. 24 and 25, respectively, and are not suitable to produce high yield high performances CZT detectors.
   (c) When Platinum is evaporated to produce the anodes 208, these anodes may be made from metal which is stiff and rigid enough to produce the amount of stress, between the Platinum metal (the anode 208) and the passivation oxide layer 206, to create the inter-band energy-levels 284 by mechanical stress that creates the local damage in the oxide layer 206. However, the Platinum metal is not reactive enough to produce the inter-band energy-levels 284 by at least partially penetrating into the oxide layer 206, in a diffusion process, to serve as a dopant which creates the levels 284. Accordingly, the anodes 208 produced by evaporation of Platinum on the CZT passivation layer 206, exhibit the electrical behavior, of rectifying contacts, shown in graphs 300 and 320 of FIGS. 24 and 25, respectively, and are suitable to produce high yield high performances CZT detectors due to the mechanical stress produced on the passivation layer 206 to produce the levels 284 even though the Platinum is a non-reactive metal that cannot produce doping in the layer 206, which is used to form levels 206.

(d) When Gold metal is evaporated to produce the anodes 208, these anodes may be made from soft metal which do not produce the amount of stress, between the Gold metal (the anodes 208) and the passivation oxide layer 206, to create the inter-band energy-levels 284 by mechanical stress that creates the local damage in the oxide layer 206. In addition, the Gold contacts 208 are not reactive enough to produce the inter-band energy-levels 284 by at least partially penetrating into the oxide layer 206, in a diffusion process, to serve as a dopant which creates the levels 284. Accordingly, the anodes 208 produced by evaporation of Gold on the CZT passivation layer 206, do not exhibit the electrical behavior, of rectifying contacts, shown in the graphs 300 and 320 of FIGS. 24 and 25, respectively, and are not suitable to produce high yield high performances CZT detectors.

From the various types of metals used to produce the anodes 208 on the passivation layer 206 and the corresponding results, the following should be noted:

1. The anodes 208 with the inter-band energy-levels 284 can be produced either by reactive metal, such as pure Indium that diffuses into the passivation layer 206 to serve as a dopant to create the levels 284 or can be produced by a stiff rigid metal, such as Platinum that produces the mechanical stress on the layer 206 to create local damage in the layer 206 to form the inter-band energy-levels 284. Accordingly it should be appreciated that metal, such Aluminum which is reactive and rigid also may be used to produce the anodes 208, as described above.
2. To create the mechanical stress for producing the local damage that produces the inter-band energy-levels 284, stiff and rigid metal contacts 208 on the passivation layer 206 are formed thick enough to create such stress. In the case that the metal contacts 208 are not thick enough, the contacts 208 may be stretched to fit to the lattice constant of the layer 206 resulting in not enough stress to produce the levels 284. Accordingly, the thickness of the stiff and rigid metal-contacts 208 that still can produce levels 284 in various embodiments is the thickness that reduces the stretch of the contacts 208 on the layer 206 by the amount that will create mechanical stress, due to the lattice mismatch between the metal contacts 208 and the layer 206, which is suitable for the creation of the levels 284.
3. In various embodiments, the metal-contacts 208 for on the layer 206 are formed from Nickel (Ni).
4. In various embodiments, the reactive metals of the contacts 208, such as Indium and Aluminum are reactive enough and thus pure enough to penetrate, by diffusion, into the passivation layer 206 to create therein, by doping, the inter-band energy-levels 284 to enhance the tunneling of charge-carriers from and to the semiconductor 204 via the layer 206.

It should be noted that the electrical behavior of the anodes 208 described above cannot be produced by conventional MOS or Schottky contacts because MOS contacts do not include the levels 284 in the oxide region and Schottky contacts do not have an oxide passivation layer. Additionally, a MOS Indium contact on a passivation layer without the inter-band energy-levels 284 is a blocking contact in both directions for any bias and polarity and an Indium contact on a CZT semiconductor does not produce a Schottky contact and behaves like symmetric Ohmic contact. In various embodiments, the Indium contact behaves like a rectifying contact that cannot be achieved by a MOS contact nor by a Schottky contact.

Unlike MOS Platinum and Gold contacts on a passivation layer without inter-band energy-levels 284 that are blocking contacts in both direction for any bias and polarity, and Platinum and Gold contacts on a CZT semiconductor that produce Schottky contacts and behave like rectifying contact due to the values of corresponding working functions relative to the working function of the CZT semiconductor, in various embodiments, the Platinum contact behaves like a rectifying contact while the Gold contact does not. Accordingly, the anodes 208 of FIG. 20 are not of the type of Schottky since the Gold contact does not behave like a Schottky contact as would be expected when the Platinum contact does behave like a Schottky contact.

Thus, it is clear, that the anodes 208 of FIG. 20 and the metal 254 of FIGS. 21-23, are contacts that are neither conventional MOS contacts nor Schottky contacts and are produced in various embodiments only by the formation of the inter-band energy-levels 284 in the passivation layer 206 of FIG. 20 or the oxide layer 270 of FIGS. 21-23 as described above.

It should be noted that the descriptions above for FIG. 20 and corresponding to FIGS. 21-23, describe the semiconductor 204 of FIG. 20 and the semiconductor 260 of FIGS. 21-23 as being of a P-type CZT. However, it should be noted that the rectifying contacts such as illustrated by FIGS. 21-23 with characterizations as shown by the graphs 300 and 320 of FIGS. 24 and 25, respectively, may be produced by semiconductors different than CZT, by N-type semiconductors and by passivation or oxide layers having the inter-band energy-levels 284, which may have different energies, different density of the energy-levels, different gradient, and different slope orientation under different voltage biases of the rectifying contacts.

Figure 26:
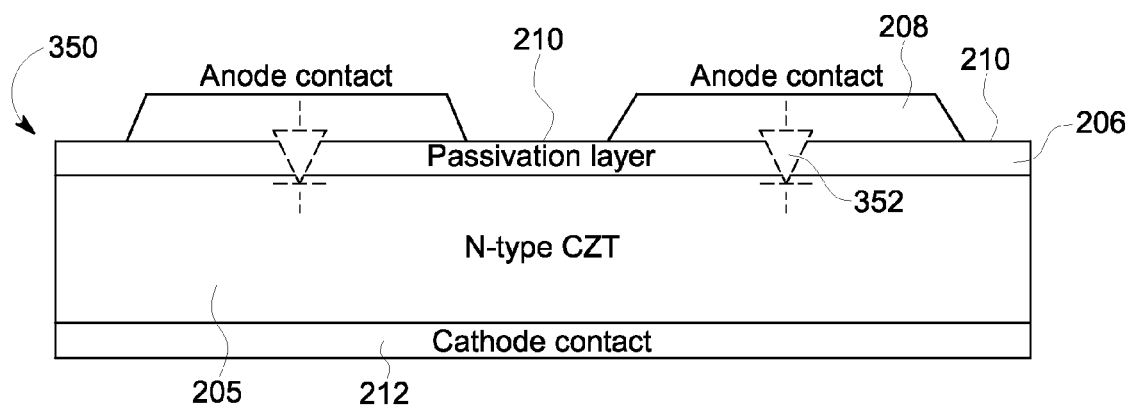
FIG. 26 is a schematic illustration of a radiation detector formed in accordance with other various embodiments.

FIG. 26 is a schematic illustration of the radiation detector 350 similar to the radiation detector 201 of FIG. 20 with the exception that the semiconductor 204 of FIG. 20 is a P-type CZT semiconductor, while the semiconductor 205 of FIG. 26 is a N-type CZT semiconductor. As described above, the anodes 208, according to various embodiments, applied on the passivation oxide layer 206 having the inter-band energy-levels 284 serve as rectifying contacts for both P-type and N-type semiconductors. The polarity of the forward bias for the P-type semiconductor is opposite to the polarity of the forward bias for the N-type semiconductor. From FIG. 22 and the description thereof, it should be clear that when the semiconductor 260 (the semiconductor 204 of FIG. 20) is a P-Type semiconductor, the polarity of the forward bias is characterized by the metal-contact 254 (the anodes 208 of FIG. 20) being negative with respect to the semiconductor 260. Accordingly, the forward bias for the anodes 208 of the detector 350 of FIG. 26 having the N-Type CZT semiconductor 205 is characterized by the metal-contact 280 being positive with respect to the semiconductor 205.

The rectifying anode-contacts 208 are schematically illustrated by the electrical diodes 352 shown in broken-lines. It should be appreciated that while the diodes 352 are oriented, according to the "conventional flow notation" according to which the flow is from the anode 208 to the semiconductor 205 via the layer 206, the "electrons flow notation", representing the real flow-direction of the electrons is in the opposite direction from the semiconductor 205 via the passivation layer 206 into the anode-contact 208. Accordingly, electrons produced by photons absorption in the semiconductor 205 drift towards the positive bias of the anodes 208 and arrive at the anode-contacts 208 when the contacts 208 are in a forward bias allowing the drift electrons to pass from the semiconductor 205 through the passivation oxide layer 206 into the anodes 208 to be collected by the anodes 208.

Figure 27:
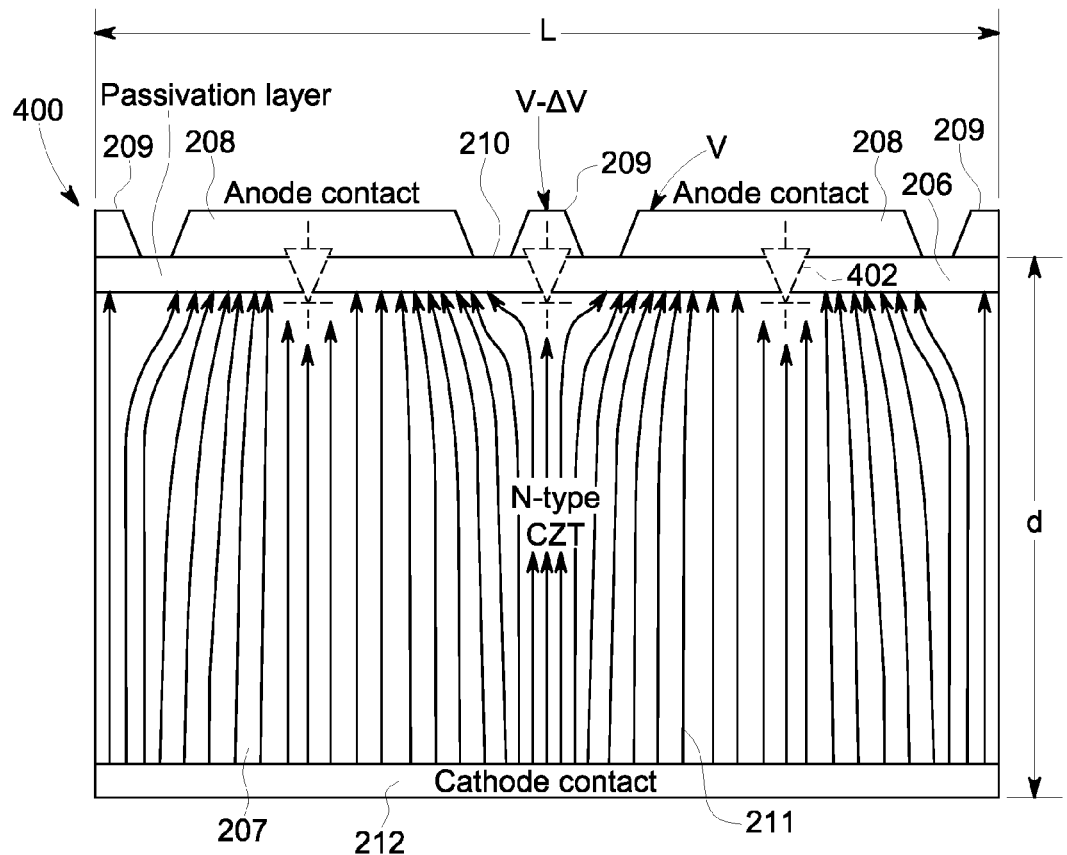
FIG. 27 is a diagram illustrating a radiation detector form in accordance with various embodiments.

FIG. 27 schematically illustrates a side view cross-section of the pixelated radiation-detector 400 similar to the radiation detector 350 of FIG. 26 with an additional steering grid 209. The detector 400 is shown along a lateral distance L including two anodes 208, one line of grid 209 located between the anodes 208 and two half lines of grid 209 (grid lines that are cut in the center) located at the edges of the range L on both sides of the anodes 208. The steering grid 209 includes grid lines aligned along the centers of the gaps 210 between the pixelated anodes 208 located above the passivation layer 206 formed, by growing process, on top of the N-Type CZT semiconductor 207. The lines of the grid 209 and the pixels of the anodes 208 both have the same pitch in various embodiments. The cathode 212 of the detector 400 is negatively biased to form the electrical field that illustrated by lines 211 originated at the cathode 212 and aligned positively toward the biased anodes 208. The lines 211 of the electrical field between the cathode 212 and the anodes 208 are the electron-trajectories along which the electrons generated by the absorption of photons in the semiconductor 207 drift towards the anodes 208 to be collected by the anodes 208.

In CZT radiation detectors, the electrical charge induced in the anodes 208 and thus the electrical signal generated in this anode, depends on the Depth Of Interaction (DOI) indicating the distance from the location where the photon that generates the electrons in the semiconductor 207 is absorbed to the anode 208. To improve the energy resolution of the detector 400, the sensitivity of the electrical signal at the anodes 208 to the value of the DOI may be reduced by using anodes having dimensions that are small compared to the thickness d of the detector 400. Small anodes 208 produce "small pixel effect" according to which, the signal induced in the anodes 208 is produced mainly in the vicinity of the anodes 208. Due to this effect, the detector 400 having small anodes 208 is not sensitive to the DOI and has good energy resolution.

However, small anodes 208 typically have poor electron collection-efficiency. To improve the electron collection efficiency of the anodes 208, the drift of the electrons toward the anodes 208 is enhanced by the steering grid 209 that is biased positively relative to the cathode 212 but, having a potential (V-ΔV) that is lower by the amount ΔV with respect to the anode 208 having the potential V. Accordingly, while the steering grid 209 improves the drift of electrons toward the anodes 208, these electrons are not collected and escape the collection of grid 209 by being attracted toward the anodes 208 having a potential higher than the potential of the grid 209.

Thus, in some embodiments, the combination of small anodes with the steering grid 209 produces the detector 400 with good energy resolution and high electron collection-efficiency. However, due to the potential difference ΔV between the anodes 208 and the grid 209, the detector 400 may suffer from high leakage current between the anodes 208 and grid 209 when the value for ΔV is large (about 100V) and the distance between the anodes 208 and the grid 209 is short (less than 100 μm). In various embodiments, the leakage current between the anodes 208 and the steering grid 209 is reduced or eliminated by using rectified contacts 208 schematically illustrated by electrical diodes 402 shown by broken lines and are similar to the diodes 352 of FIG. 26, i.e. the rectifying anode-contacts 208 are oriented, according to the "conventional flow notation" according to which the flow is from the anode 208 to the semiconductor 207 via the layer 206. However, the "electrons flow notation", representing the real flow-direction of the electrons is in the opposite direction from the semiconductor 207 via the passivation layer 206 into the anode-contact 208. Accordingly, electrons produced, by photons absorption in the semiconductor 207, drift toward the positive bias of the anodes 208 and the grid 209 and arrive at the anode-contacts 208 when the contacts 208 are in a forward bias allowing the drift electrons to pass from the semiconductor 207 through the passivation oxide layer 206 into the anodes 208 to be collected by the anodes 208 while escaping the collection by the grid 209.

Figure 28:
FIG. 28 is a diagram of an electrical equivalent circuit for various embodiments.
Figure 29:
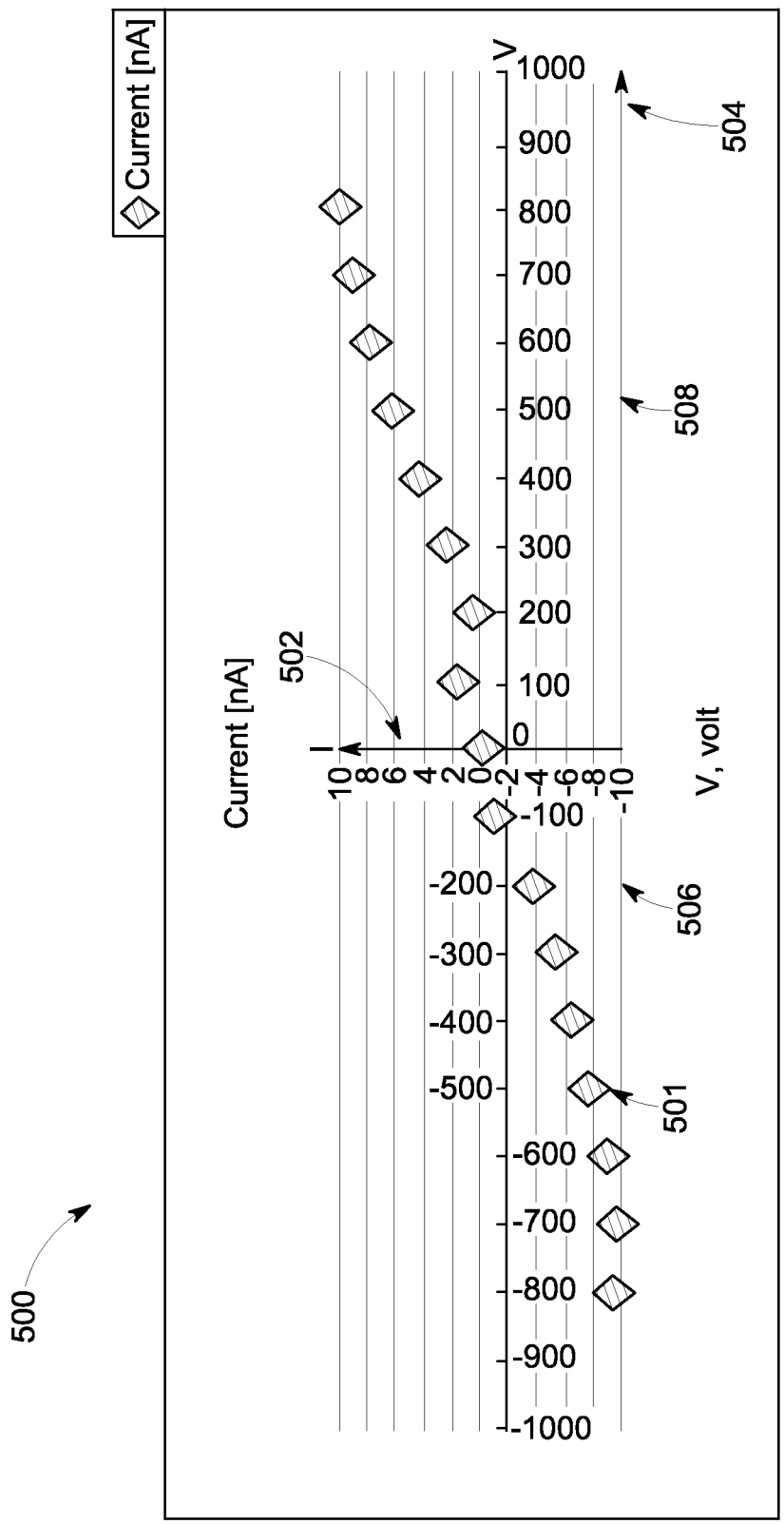
FIG. 29 is another graph of a current-voltage curve in accordance with various embodiments.
Figure 30:
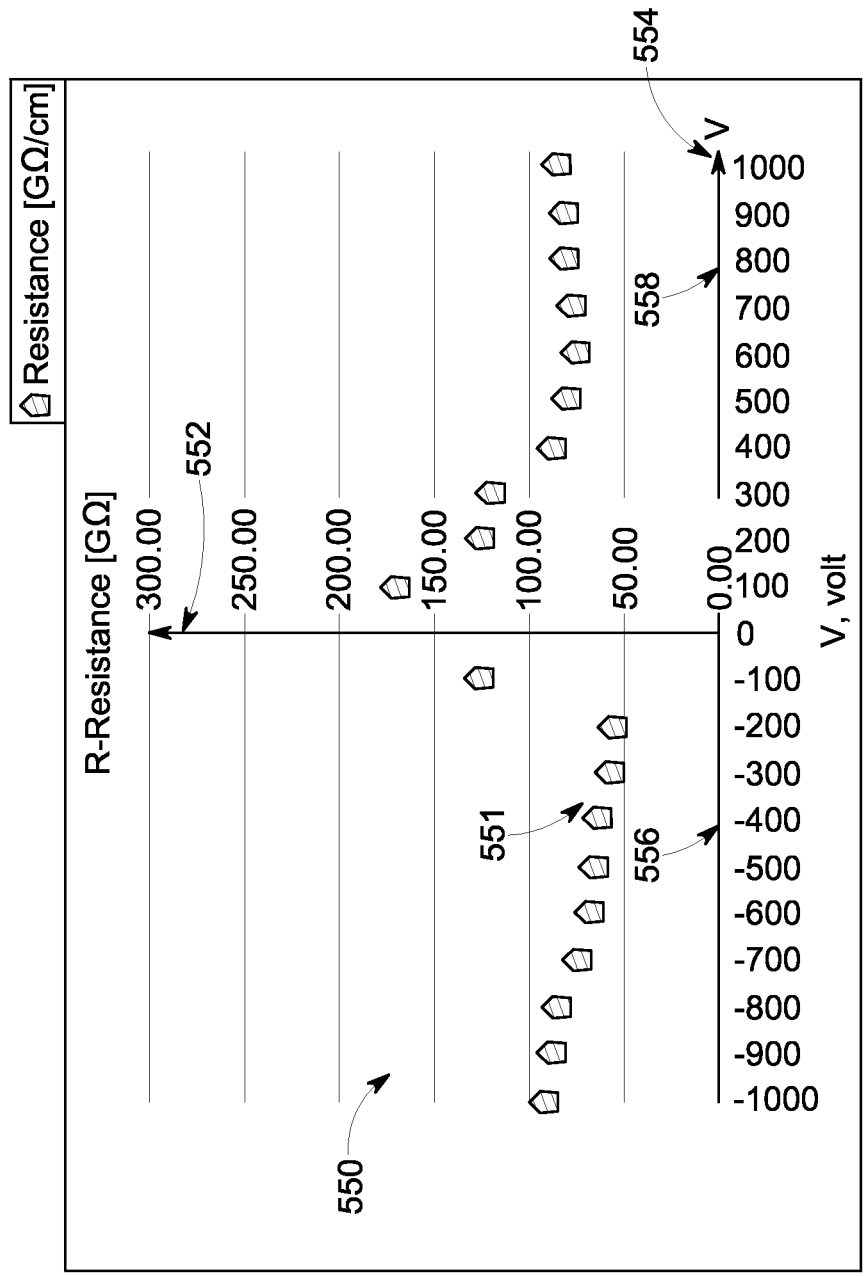
FIG. 30 is another graph of a resistance curve in accordance with various embodiments.

FIGS. 28-30 illustrate the leakage current between the anodes 208 and the grid 209 may be reduced by rectifying the anode contacts 208 and the grid contacts 209. FIG. 28 illustrates an electrical equivalent circuit 450 representing the electrical rectifying contacts between the anode 208 and the grid 209 of FIG. 27 having potentials V and (V-ΔV), respectively. From the circuit 450 it can be seen that two electrical diodes 402 are connected in series and aligned head-to-head. This means that one of the diodes 402 is in reverse bias and has very high resistance, which ensures that the leakage current between the anodes 208 and the steering grid 209 is low. Accordingly, the rectifying anode contacts 208 and the rectifying grid contacts 209 reduce or eliminate the leakage current between the anodes 208 and the grid 209 to produce detector, such as the detector 400 of FIG. 27, which in various embodiments has good energy resolution, high electron collection-efficiency and low leakage-current between the anodes 208 and grid 209.

FIG. 29 is a graph 500 showing a Current-Voltage (I-V) curve 501 as measured between the anode 208 and the steering grid 209 of the CZT detector of FIG. 27 or the equivalent electrical circuit 450 of FIG. 28. The measured current is the current that flows between the anode 208 and the grid 209 via the passivation layer 206 as a function of the voltage applied between the anode 208 and the grid 209 of FIG. 27 or 28 corresponding to the measurement of the current that flows via the two electrical diodes 402 of FIG. 28 connected in series and oriented head-to-head. Since one of the diodes 402 is in a reverse bias, for any bias polarity, the diode 402 is under a blocking condition and has very low current passing therethrough. This corresponds to high resistance, which is dominant in comparison to the diode 402 that is in forward bias, under the same bias conditions in which the other diode 402 is in the blocking state. Accordingly, for any bias polarity, the resistance between the anode 208 and the grid 209 is similar to the resistance of the diode 402 under reverse bias corresponding to blocking state and low current.

The values of the measured current that flows between the anode 208 and the grid 209 in Nano Ampere units [nA] are marked along Y-axis 502 of the graph 500 and the values of the measured voltage between the anode 208 and the grid 209 in Volts units [V] are marked along X-axis 504 of the graph 300.

The negative values of the voltage between the anode 208 and the grid 209 appear in the negative part 506 of X-axis of the graph 500. This region includes one diode in a blocking state and corresponds to the situation illustrated by FIG. 23 in which the MOS contact (the diodes 402) is in reverse-bias. The positive values of the voltage between the anode 208 and the grid 209 appear in the positive part 508 of X-axis of the graph 500. This region includes one diode in a blocking state and corresponds to the situation illustrated by FIG. 23 in which one of the MOS contacts (the diodes 402) is in reverse-bias.

From the graph 500, it can be seen that for any bias polarity between the anode 208 and the grid 209 and as described above, the current between the anode 208 and the grid 209 is similar to the current of the diode 402 in a blocking state (see also the region 308 of the graph 300 of FIG. 24) and, thus, provides a low leakage current between the anode 208 and the grid 209.

FIG. 30 is a graph 550 showing a resistance curve 551 as measured on a N-Type CZT detector between the anode 208 and the grid 209 of FIG. 27 or the electrical equivalent circuit of FIG. 28. The measured resistance is the resistance between the anode 208 and the grid 209 of FIG. 27 measured as a function of the voltage applied between the anode 208 and the grid 209 of FIG. 27 or 28 corresponding to the resistance of the diode 402 in a blocking state. The values of the measured resistance between the anodes 208 and the grid 209 in Giga-Ohm units [GΩ] are marked along Y-axis 552 of the graph 550 and the values of the measured voltage between the anode 208 and grid 209 in Volts units [V] are marked along X-axis 554 of graph 550.

The negative values of the voltage between the anode 208 and the grid 209 appear in the negative part 556 of X-axis of the graph 550. This region includes one diode in a blocking state and corresponds to the situation illustrated by FIG. 23 in which the MOS contact (the diodes 402) is in reverse-bias (low current and high resistance). Similarly, the positive values of the voltage between the anode 208 and the grid 209 appear in the positive part 558 of X-axis of the graph 550. This region, similar to the negative region, includes one diode in a blocking state and corresponds to the situation illustrated by FIG. 23 in which the MOS contact (the diodes 402) is in reverse-bias.

From the graph 550, it can be seen that for any bias polarity between the anode 208 and grid the 209 and as described above, the resistance between the anode 208 and the grid 209 is similar to the resistance of the diode 402 in a blocking state and, thus, provides high resistance (low leakage current) between the anode 208 and the grid 209. From the shape of the resistance curve 551 in the graph 550 of FIG. 30, it can be seen that in the bias range between −200V to +300V the curve has a dynamic negative resistance. Such dynamic negative resistance is typical to a tunneling effect via an oxide layer having low density inter-band energy levels, such as the passivation oxide layer 206 that has the inter-band energy-levels 284 of FIGS. 21-23, respectively.

Figure 31:
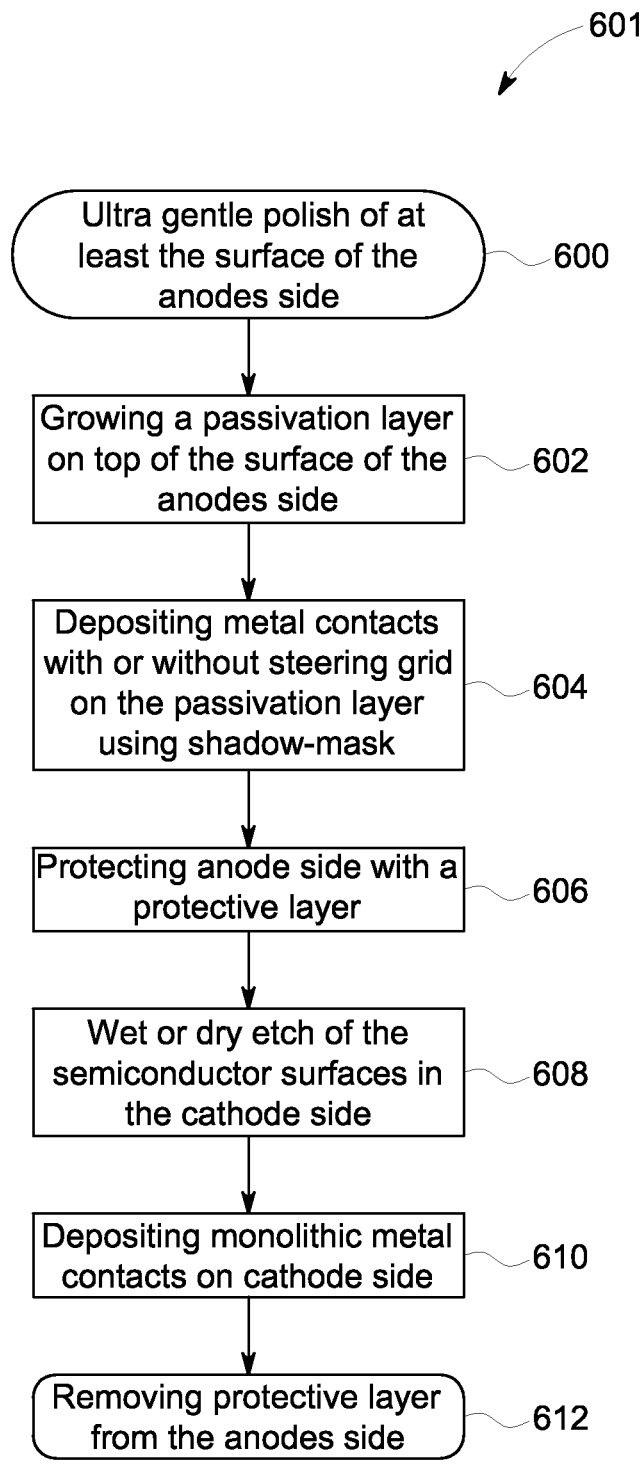
FIG. 31 is a flow chart of a method for fabricating radiation detectors in accordance with other various embodiments.

FIG. 31 is a flowchart 601 illustrating and describing a method, including the processing steps in the fabrication sequence of a detector, for example, the detector 201 illustrated by FIGS. 14-20 or the detector 400 of FIG. 27 having pixelated anodes 208 or having the anodes 208 combined together with the steering grid 209 placed in the centers of the gaps between the anodes 208, respectively.

The fabrication steps illustrated by FIG. 14-20 or 27 (which in the illustrated embodiment include seven steps) correspond to the steps 600-612 illustrated by the flowchart 601 as described in more detail above. In general, and in various embodiments, a gentle polish is performed at 600 and is followed by the growth of an encapsulation and passivation oxide layer at 602, by plasma process, on the top of the surface of the anode side. Deposition of pixelated anode metal contacts with or without a steering grid are applied by evaporation via a shadowing mask, at 604, on top of the encapsulation and passivation layer, which is grown on the surface of the anode side. The steering grid may not be continuous and may include narrow gaps to allow the use of shadowing mask.

A protection layer on the surface of the anodes side is applied at 606 followed by a wet or dry etch of the surface on the cathode side opposite to the anodes side at 608. A deposition of a monolithic metal contact on the surface of the cathode side is applied at 610 followed by the removal of the protecting layer from the anodes side at 612.

Accordingly, by practicing various embodiments, a pixelated radiation detector with rectifying anode contacts may be fabricated with an efficient and simple fabrication process due to a high production yield achieved. The formation of the grown encapsulation and passivation oxide layer 206 facilitate the fabrication process and enhance the detector stabilization, reliability and performances. The gentle non-standard polishing together with the encapsulation and passivation layer 206 produce the gaps 210 having the high resistivity surfaces with a resistivity similar to the resistivity of the bulk of the semiconductor 204 resulting in a higher performance radiation detector produced with high production yield at relatively low cost.

Variations and modifications are contemplated. For example, although the semiconductor 204 in various embodiments is described as being a CZT semiconductor, the semiconductor may be formed from any suitable material. Additionally, although the anodes 208 and the cathode 212 are described as made of Indium, the anodes 208 and the cathode 212 may be formed from any type of material, particularly any type of metal. Moreover, although the electrical contacts of the anodes 208 are described as the rectifying electrical contacts, the cathode 212 may be of an Ohmic, rectifying or blocking electrical type of contacts. Also, although the first and second surfaces of the anodes 208 and the cathode 212, respectively, of the semiconductor 204 are described as being polished simultaneously in the same fabrication step, these surfaces may be polished at different fabrication steps, which may or may not be concurrent.

Additionally, although the anodes 208 and cathode 212 are described as being produced in different fabrication steps, the anodes 208 and cathode 212 may be formed simultaneously or currently at the same fabrication step. Further, although the grains in the slurry used in the last polishing steps are described in one embodiment as having a size of 0.05 μm these grains may have any size, such as less than 0.1 μm. Also, the size of the grains of the slurry of the various polishing steps may have any size.

Additionally, although the formation of the rectifying anode contacts 208 is described as formed by applying reactive metals, such as Indium or Aluminum, to form, by a doping process of at least partial diffusion, inter-band energy-levels 284 in the passivation oxide layer 206 on which these metals are applied, other reactive metals may be used to form the inter-band energy-levels 284 in the passivation oxide layer 206. Additionally, although the formation of the rectifying anode contacts 208 is described as formed by applying stiff and or rigid metals, such as Platinum or Aluminum on the passivation oxide layer 206 to form, by creating local damage produced by mechanical stress, the inter-band energy-levels 284 in the passivation oxide layer 206 on which these metals are applied, other stiff and or rigid metals may be used to form the inter-band energy-levels 284 in the passivation oxide layer 206.

Thus, various embodiments provide methods for fabricating a radiation detector, such as a pixelated radiation detector, which may include a steering grid, and without chemical etching to remove damaged layers at least from the surface on the anodes side of semiconductor 204. Accordingly, in various embodiments, a completely dry process with no chemical etching is used on the surface of the semiconductor 204 on the side of the anode contacts 208.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A method for fabricating a radiation detector, the method comprising:

mechanically polishing at least a first surface of a semiconductor wafer using a polishing sequence including a plurality of polishing steps to form a polished first surface, wherein a last polishing step of the polishing sequence includes polishing with a slurry having a grain size smaller than about 0.1 μm to create the polished first surface;

growing a passivation oxide layer on a top of the polished first surface to seal and passivate the polished first surface;

depositing patterned metal contacts on a top of the passivation oxide layer having at least one pattern being (i) a pattern of pixelated anode electrodes or (ii) a pattern of pixelated anode electrodes with grid electrodes having lines of electrodes aligned along centers of gaps between the pixelated anode electrodes;

applying a protecting layer on a top of the patterned metal contacts to protect a first surface of the patterned metal contacts;

etching a second surface of the semiconductor wafer to form an etched second surface;

applying a monolithic cathode electrode on the etched second surface of the semiconductor wafer; and removing the protecting layer from the patterned metal contacts on the first surface, wherein the patterned metal contacts are formed from one of (i) reactive metals and (ii) stiff-rigid metals for producing inter-band energy-levels in the passivation oxide layer.

2. The method of claim 1, wherein the inter-band energy-levels enhance a tunneling of charge-carriers from and to the semiconductor wafer via the passivation oxide layer for causing the patterned metal contacts to behave as electrical rectifying contacts, the inter-band energy-levels formed in the passivation oxide layer by one of (i) diffusion of at least part of the patterned metal contacts into the passivation oxide layer to create doping therein (ii) creating local damage in the passivation oxide layer by producing mechanical stress between the patterned metal contacts and the passivation oxide layer.

3. The method of claim 1, wherein the mechanical polishing forms the polished first surface having a resistivity substantially the same as a bulk resistivity of the semiconductor wafer.

4. The method of claim 1, wherein the passivation oxide layer cause the first surface to have a resistivity substantially the same as a bulk resistivity of the semiconductor wafer.

5. The method of claim 1, wherein the semiconductor wafer is one of an N-Type semiconductor and a P-Type semiconductor.

6. The method of claim 1, wherein the grid electrodes is a steering grid that is biased by a voltage potential lower than a voltage potential of the pixelated anode electrodes.

7. The method of claim 1, wherein the patterned metal contacts are one of Indium, Platinum, Aluminum or Nickel.

8. The method of claim 7, wherein the patterned metal contacts have a reactive level to at least partially penetrate into the passivation oxide layer to create therein the inter-band energy-levels.

9. The method of claim 7, wherein the patterned metal contacts are formed to have a thickness, stiffness and rigidity in amounts that create mechanical stress on the passivation oxide layer to produce, in the passivation oxide layer, the inter-band energy-levels.

10. The method of claim 1, wherein the etching of the second surface produces in the etched regions a semiconductor having an excess of one of a component of the semiconductor wafer material.

11. The method of claim 1, wherein the etching of the second surface comprises one of a chemical wet etching and an ion-etching.

12. The method of claim 1, wherein the semiconductor wafer comprises Cadmium Zinc Telluride (CZT).

13. The method of claim 1, wherein the passivation oxide layer comprises Tellurium Oxide (TeO2).

14. The method of claim 1, wherein the passivation oxide layer is grown on the semiconductor wafer using a plasma process.

15. The method of claim 14, wherein the plasma process includes ionizing of gas by microwave radiation.

16. The method of claim 15, wherein the gas is a mixture of gases including oxygen.

17. The method of claim 1, wherein the pixelated anode electrodes and the monolithic cathode electrode are formed from a metal, the metal being at least one of Indium, Gold, Platinum, Nickel or Aluminum.

18. The method of claim 1, wherein the patterned metal contacts are applied to the semiconductor wafer by a processing technique including evaporation via a shadowing mask.

19. The method of claim 1, wherein the monolithic cathode electrode produced on the semiconductor wafer is formed from electrical contacts being one of Ohmic contacts or blocking contacts.

20. The method of claim 1, wherein the first and second surfaces of the semiconductor wafer are polished simultaneously in a same fabrication step.

21. The method of claim 1, wherein the first and second surfaces of the semiconductor wafer are polished in a plurality of different fabrication steps.

22. The method of claim 1, wherein a leakage current between the pixelated anode electrodes and the grid electrodes flows along a path including a rectifying contact that is reversely biased and is in a blocking state.

23. The method of claim 1, wherein the pixelated anode electrodes and the monolithic cathode electrode are applied to the semiconductor wafer simultaneously in a same fabrication step.

24. The method of claim 1, wherein the pixelated anode electrodes and the monolithic cathode electrode are applied to the semiconductor wafer in a plurality of different fabrication steps.

25. The method claim of claim 1, wherein the last polishing step includes a slurry having grain size of about 0.05 μm.

* * * * *